United States Patent
Lai et al.

(10) Patent No.: US 11,264,489 B2
(45) Date of Patent: Mar. 1, 2022

(54) NEGATIVE-CAPACITANCE AND FERROELECTRIC FIELD-EFFECT TRANSISTOR (NCFET AND FE-FET) DEVICES

(71) Applicant: Taiwan Semiconductor Manufacturing Company, Ltd., Hsinchu (TW)

(72) Inventors: Te-Yang Lai, Hsinchu (TW); Chun-Yen Peng, Hsinchu (TW); Sai-Hooi Yeong, Zhubei (TW); Chi On Chui, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/825,874

(22) Filed: Mar. 20, 2020

(65) Prior Publication Data
US 2021/0296469 A1 Sep. 23, 2021

(51) Int. Cl.
*H01L 29/66* (2006.01)
*H01L 29/51* (2006.01)
*H01L 21/02* (2006.01)
*H01L 29/78* (2006.01)

(52) U.S. Cl.
CPC ...... *H01L 29/6684* (2013.01); *H01L 21/0228* (2013.01); *H01L 29/516* (2013.01); *H01L 29/517* (2013.01); *H01L 29/78391* (2014.09)

(58) Field of Classification Search
CPC ............ H01L 29/516; H01L 29/6684; H01L 29/78391; H01L 29/42364; H01L 21/823857; H01L 29/517; H01L 21/28185; H01L 21/823821; H01L 21/823878; H01L 21/266; H01L 29/66545; H01L 21/31053; H01L 21/31111; H01L 21/76224
See application file for complete search history.

(56) References Cited

U.S. PATENT DOCUMENTS

| | | | |
|---|---|---|---|
| 10,861,862 B1* | 12/2020 | Lu | H01L 27/11504 |
| 2019/0057860 A1* | 2/2019 | Yoon | H01L 21/3115 |
| 2019/0067488 A1* | 2/2019 | Tsai | H01L 21/823431 |
| 2020/0020762 A1* | 1/2020 | Frank | H01L 21/02356 |

\* cited by examiner

*Primary Examiner* — Julia Slutsker
(74) *Attorney, Agent, or Firm* — Slater Matsil, LLP

(57) ABSTRACT

Negative capacitance field-effect transistor (NCFET) and ferroelectric field-effect transistor (FE-FET) devices and methods of forming are provided. The gate dielectric stack of the NCFET and FE-FET devices includes a non-ferroelectric interfacial layer formed over the semiconductor channel, and a ferroelectric gate dielectric layer formed over the interfacial layer. The ferroelectric gate dielectric layer is formed by inserting dopant-source layers in between amorphous high-k dielectric layers and then converting the alternating sequence of dielectric layers to a ferroelectric gate dielectric layer by a post-deposition anneal (PDA). The ferroelectric gate dielectric layer has adjustable ferroelectric properties that may be varied by altering the precisely-controlled locations of the dopant-source layers using ALD/PEALD techniques. Accordingly, the methods described herein enable fabrication of stable NCFET and FE-FET FinFET devices that exhibit steep subthreshold slopes.

20 Claims, 21 Drawing Sheets

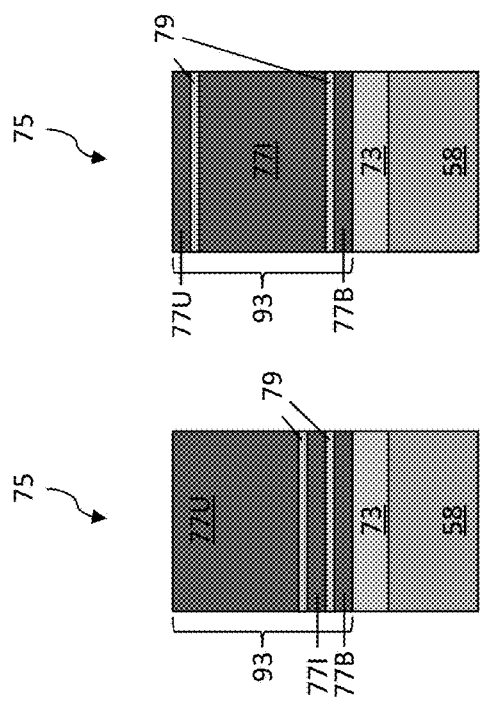
Figure 14G
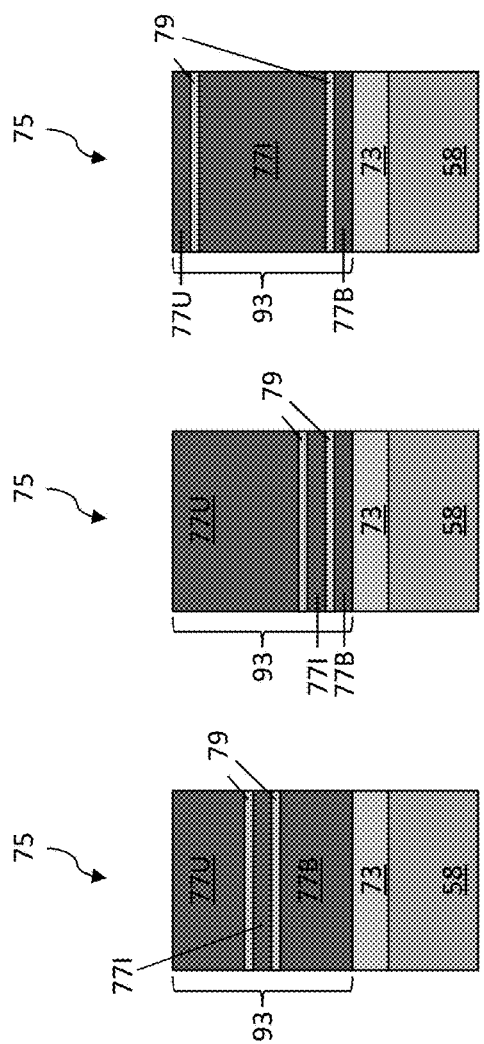
Figure 14F
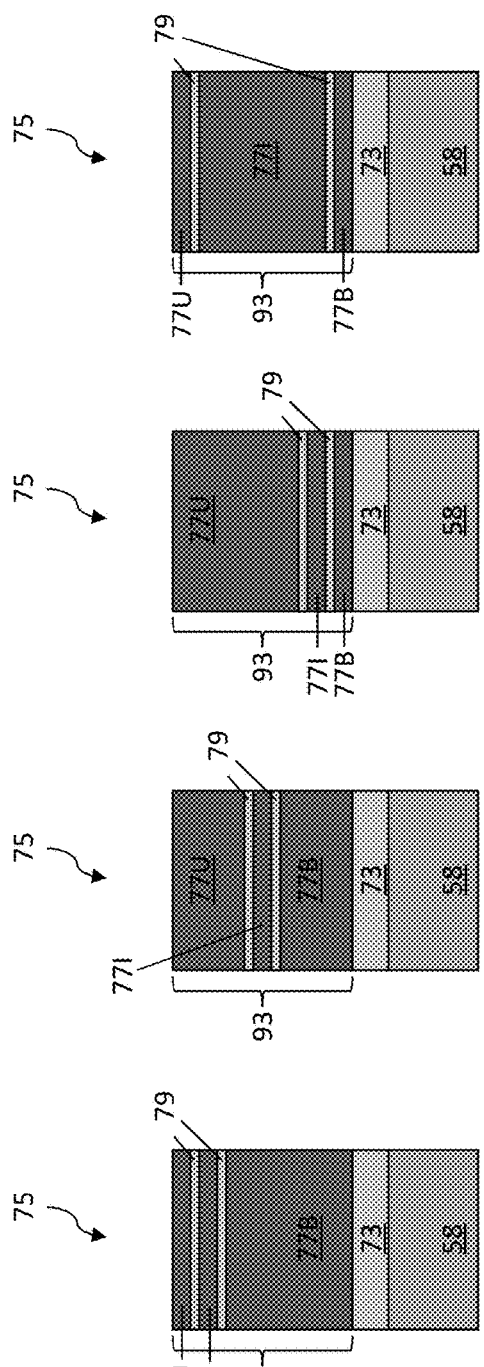
Figure 14E
Figure 14H
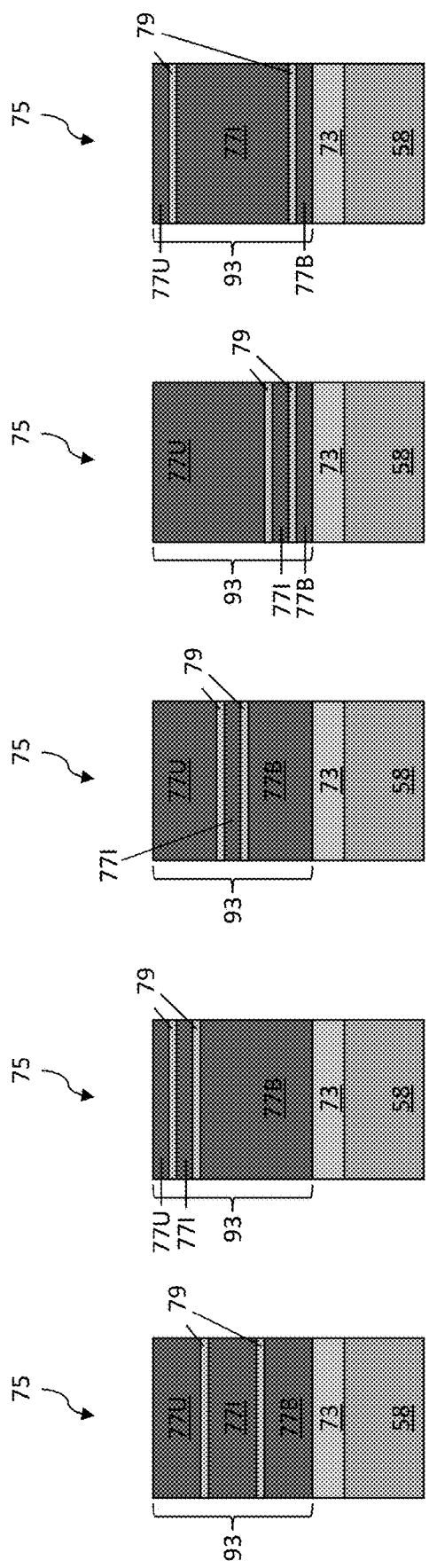
Figure 14D
Figure 14C

# NEGATIVE-CAPACITANCE AND FERROELECTRIC FIELD-EFFECT TRANSISTOR (NCFET AND FE-FET) DEVICES

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
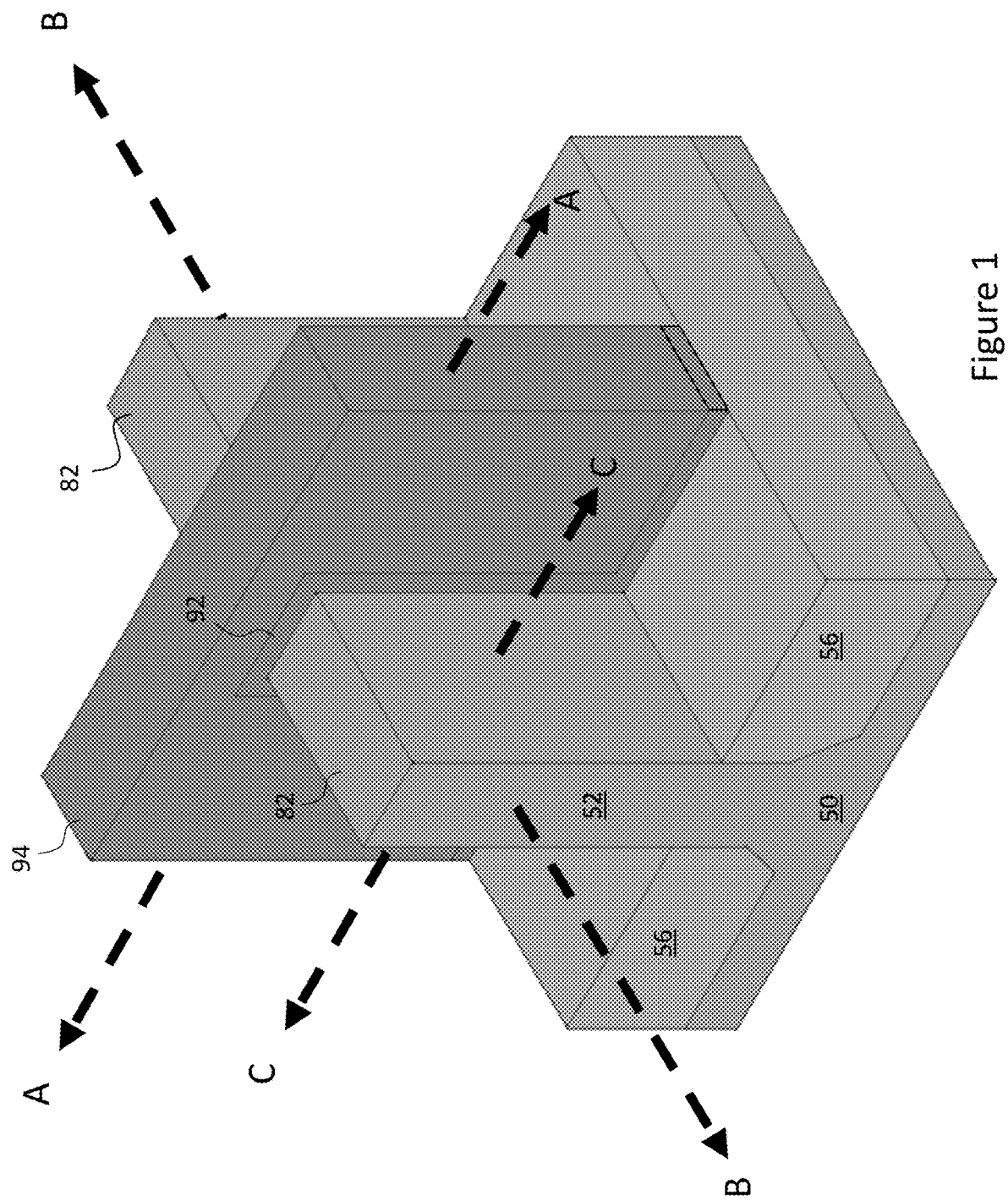
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure several embodiments of negative-capacitance, field-effect transistor (NCFET) devices, and methods to fabricate the NCFET and FE-FET devices in an integrated circuit have been described. The NCFET and FE-FET devices described herein utilize a gate dielectric stack comprising ferroelectric dielectric layers in combination with other non-ferroelectric dielectric layers (e.g., an interfacial layer). As described in greater detail below, the embodiments comprise methods to form an amorphous dielectric layer embedded with dopant-source layers and utilize a thermal treatment to dope the dielectric layers to form a ferroelectric polycrystalline dielectric layer with stable ferroelectric properties that may be customized by adjusting the fabrication process conditions. The ferroelectric dielectric layers provide a layer having a negative capacitance of magnitude $C_{fe}$. The negative capacitance when combined with the capacitance of the non-ferroelectric dielectric layers provides a high capacitance of the combined dielectric stack. Such a dielectric stack may provide certain advantages when used in a device, for example, used as a gate dielectric layer of a transistor.

An advantage of the structures and methods such as those described herein is that the fabrication process may be adjusted to tailor the negative capacitance $C_{fe}$ of the ferroelectric dielectric layer to meet the $I_d$ vs. $V_g$ specifications for the NCFET, where $I_d$ refers to the drain current and $V_g$ refers to the gate voltage of the transistor. The embodiments of NCFETs and FE-FETs described in this disclosure are in the context of FinFETs, which are three-dimensional (3D) MOSFETs built on fin-shaped semiconductor strips. However, it is understood that aspects of this invention may be applied to other 3D structures (e.g. gate-all-around (GAA) MOSFETs) or planar structures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 14K and 15A through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 14I, 15A, and 16A are illustrated along reference cross-section A-A illustrated in FIG. 1, and FIGS. 8B, 9B, 10B, 11B, 12B, 13B, 14B-14H, 14J, 14K, 15B, and 16B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
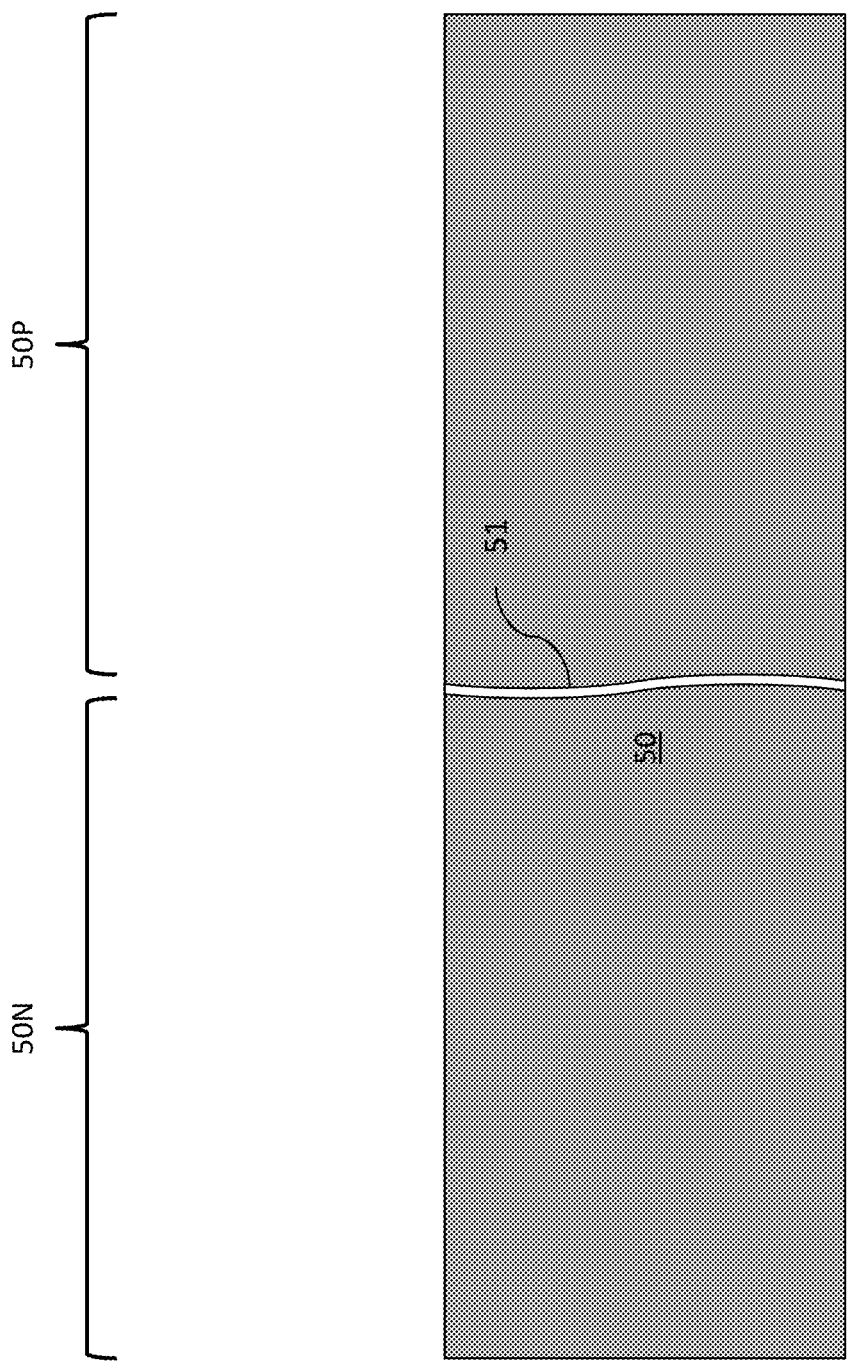
FIGS. 2 through 14K and 15A, 15B, 16A, and 16B are cross-sectional views of intermediate stages in the manufacturing of NCFET FinFETs and FE-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
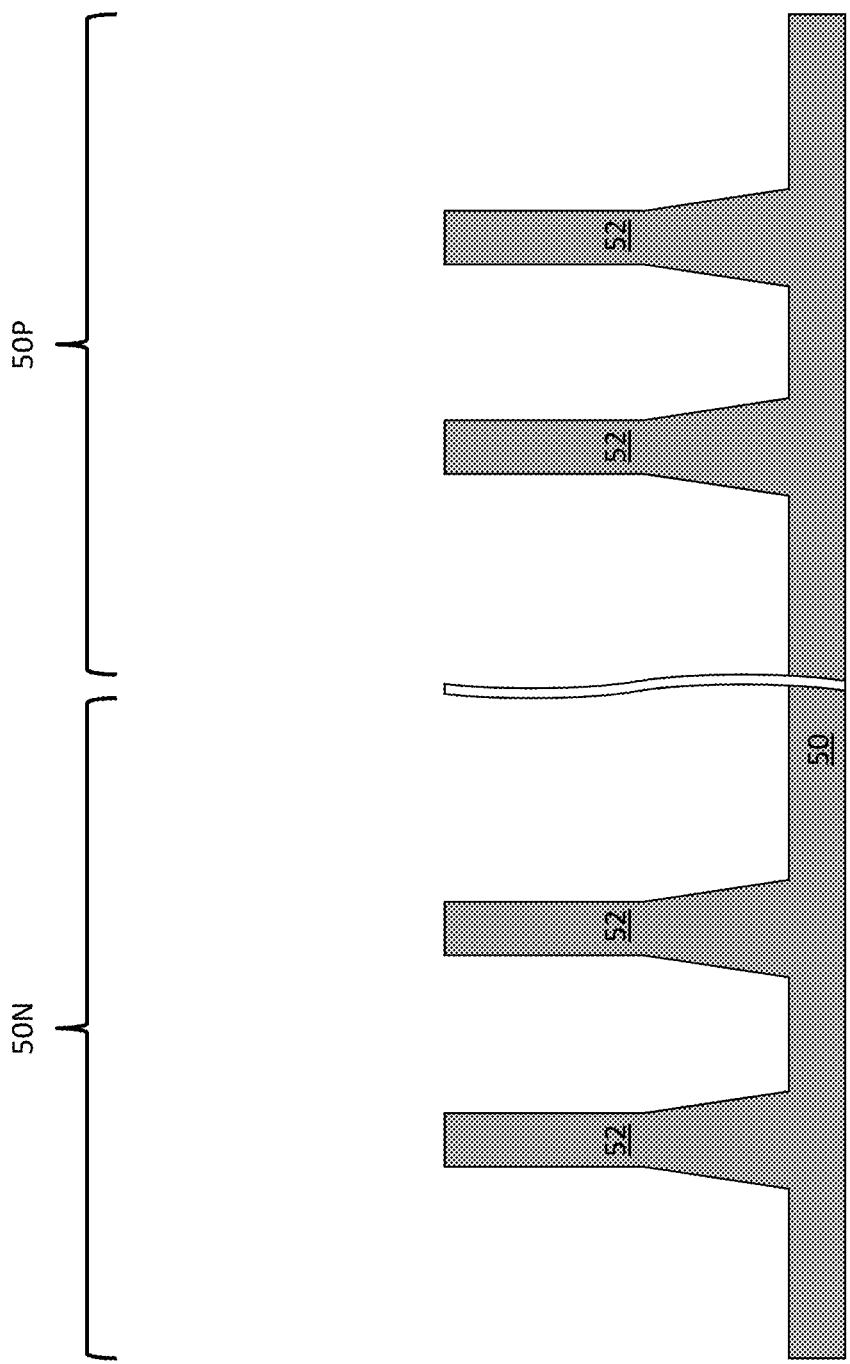

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to pattern the fins 52. In some embodiments, the mask may remain on the fins 52.

Figure 4:
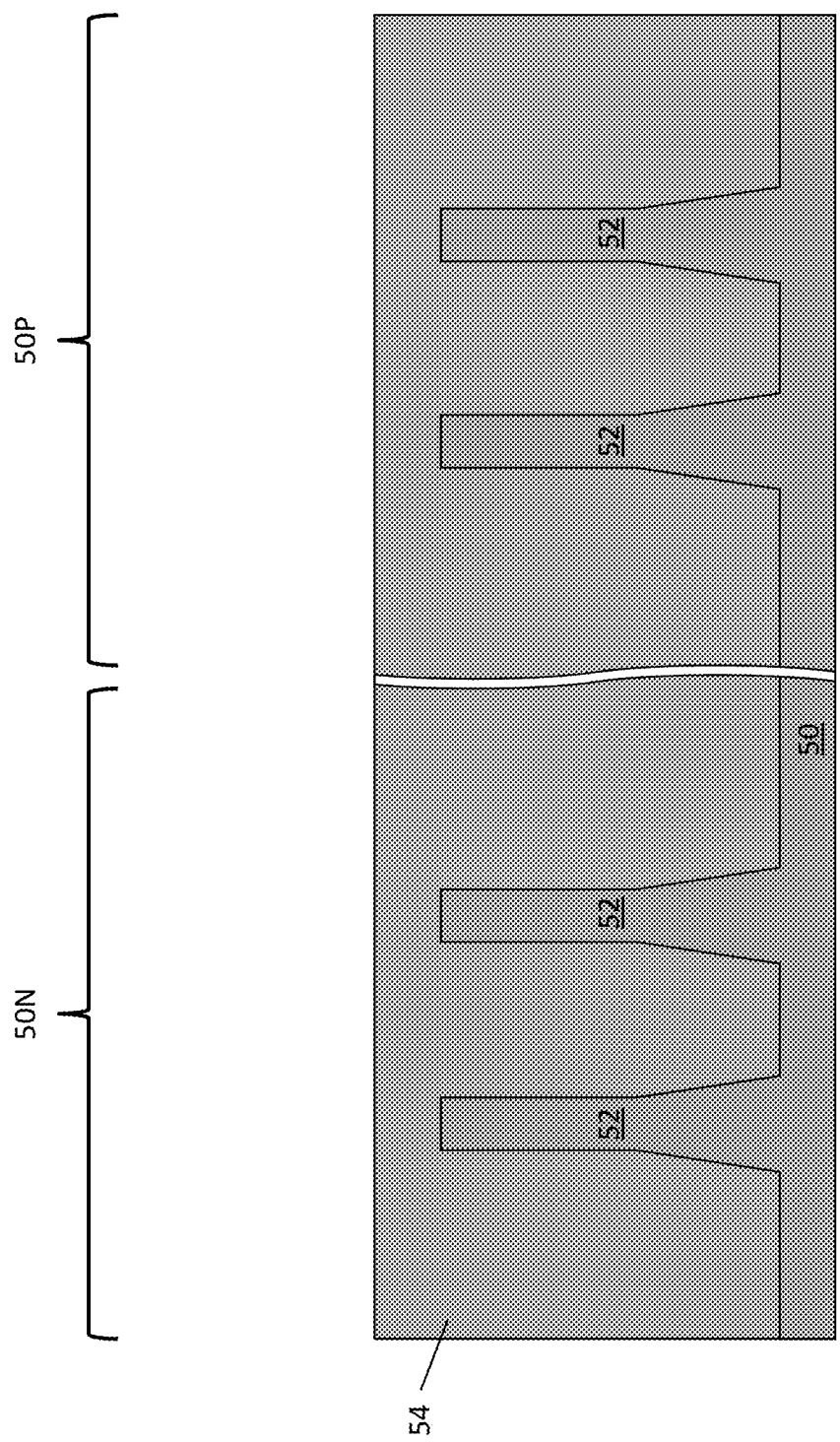

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
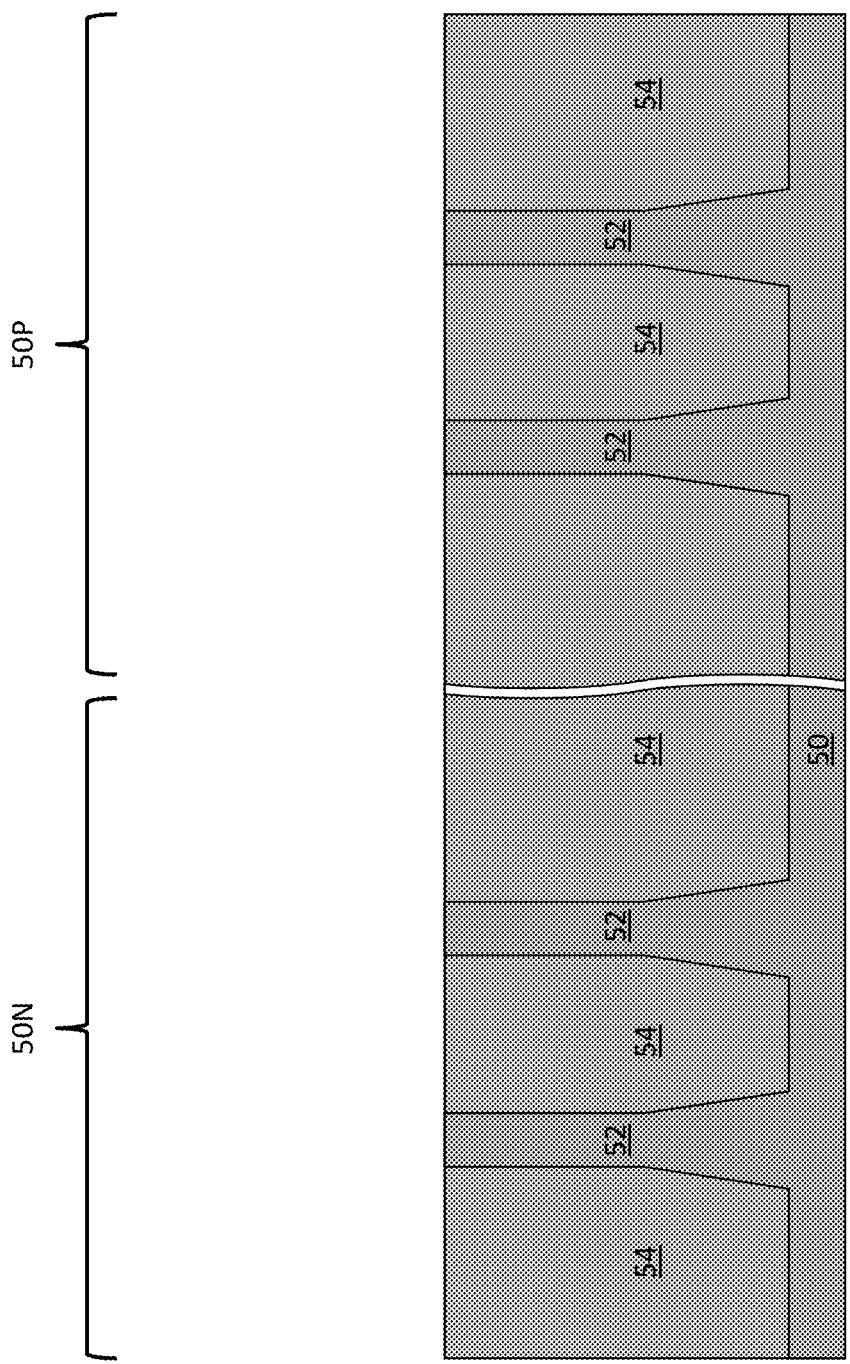

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
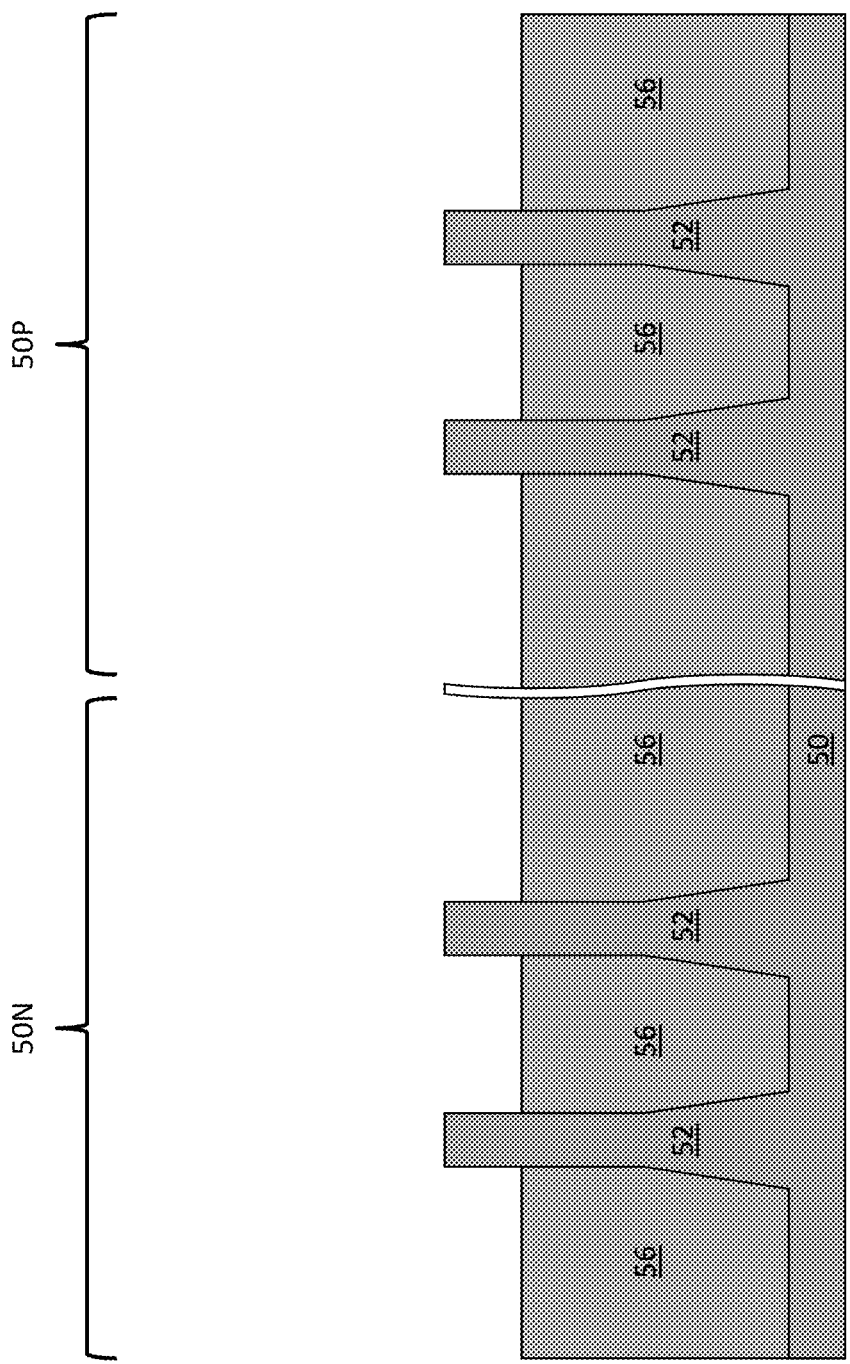

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
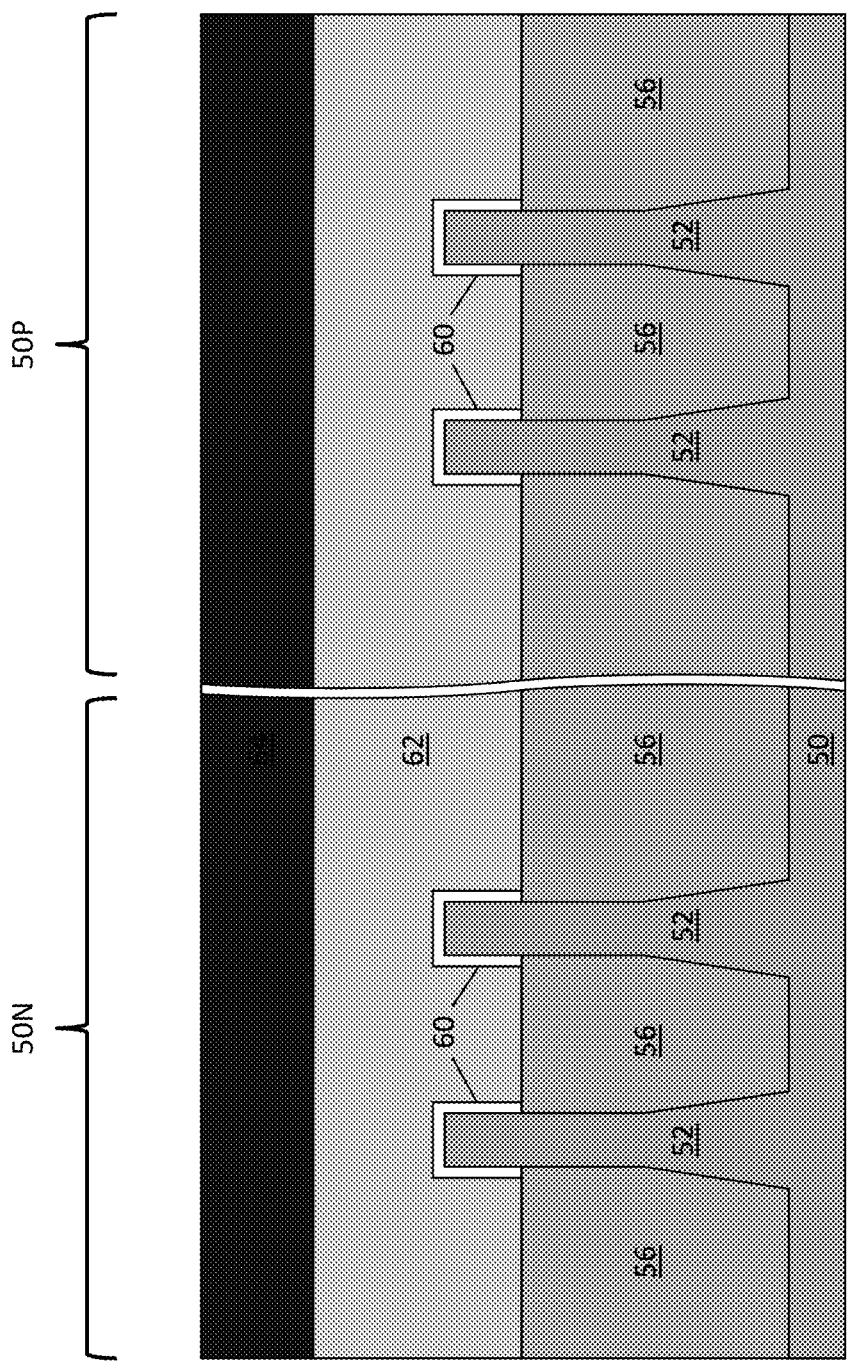

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material such as amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
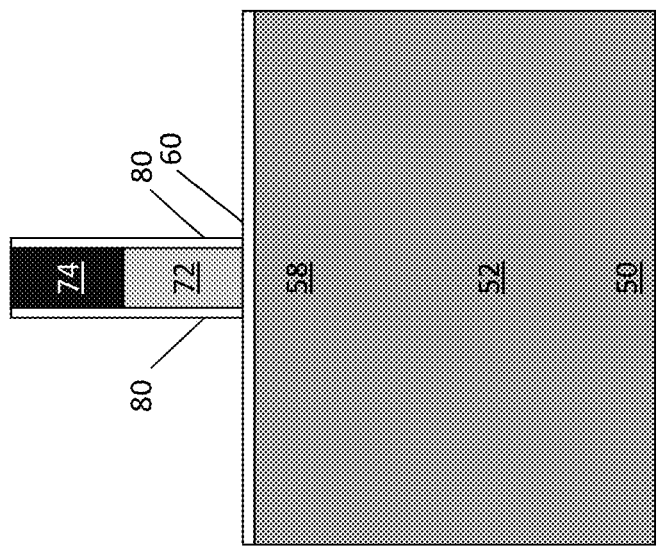
Figure 8A:
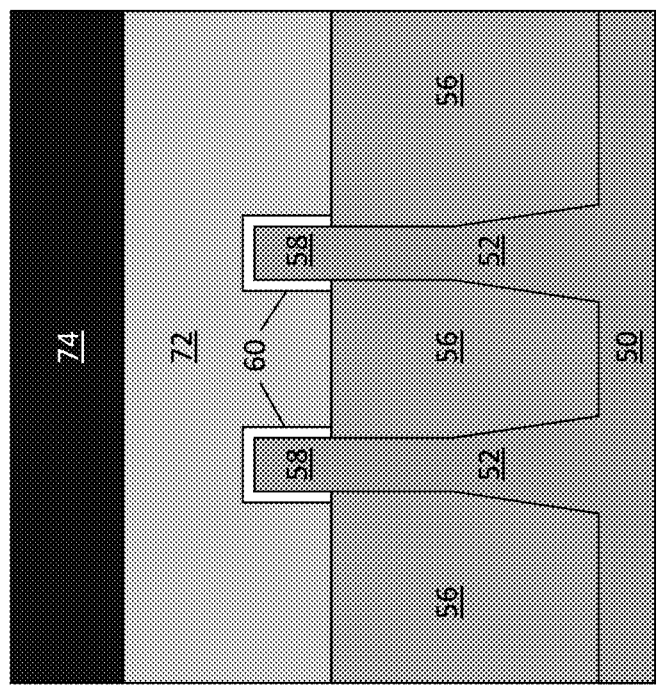

In FIGS. 8A and 8B, the mask layer 64 (see FIG. 7) may be patterned using acceptable photolithography and etching techniques to form masks 74. The pattern of the masks 74 then may be transferred to the dummy gate layer 62 to form the dummy gates 72. In some embodiments (not illustrated), the pattern of the masks 74 may also be transferred to the dummy dielectric layer 60. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of $SiO_2$, SiN, SiON, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{18}$ cm$^{-3}$. An anneal may be used to activate the implanted impurities.

Figure 9B:
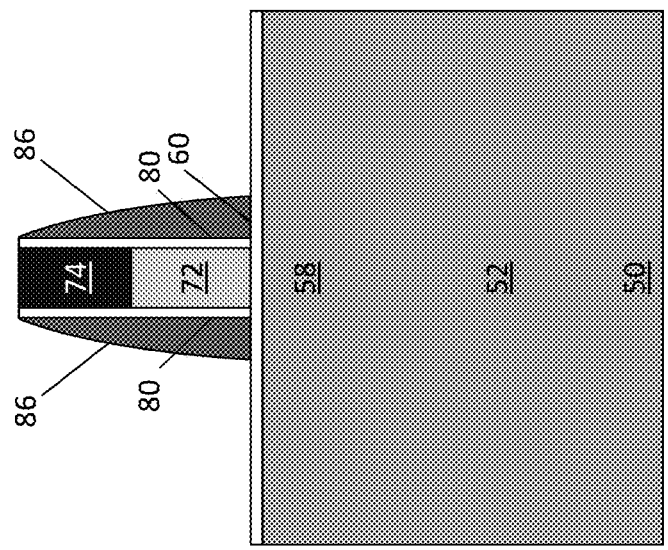
Figure 9A:
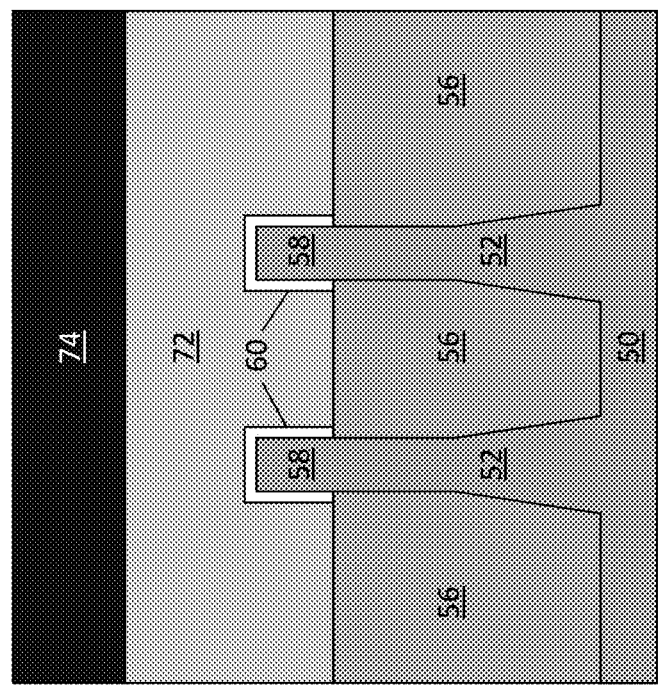

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, SiON, SiCN, a combination thereof, or the like.

Figure 10B:
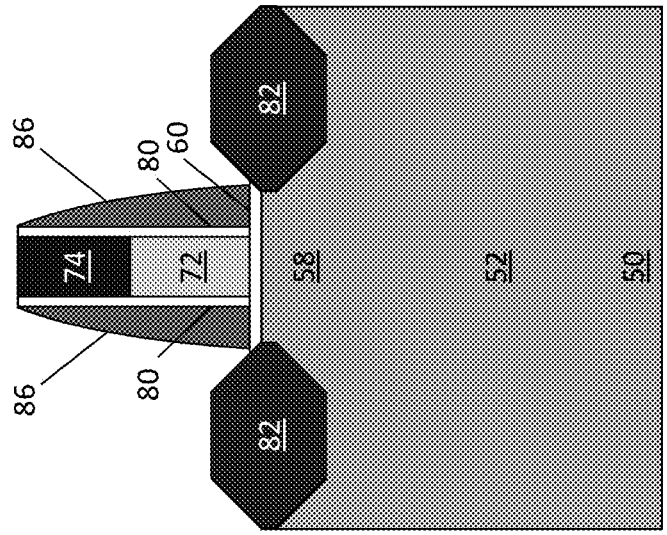
Figure 10A:
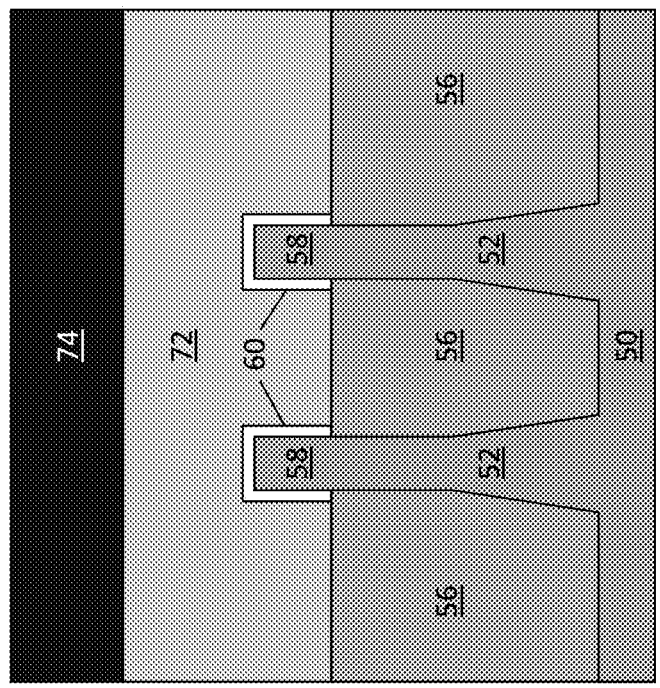
Figure 10C:
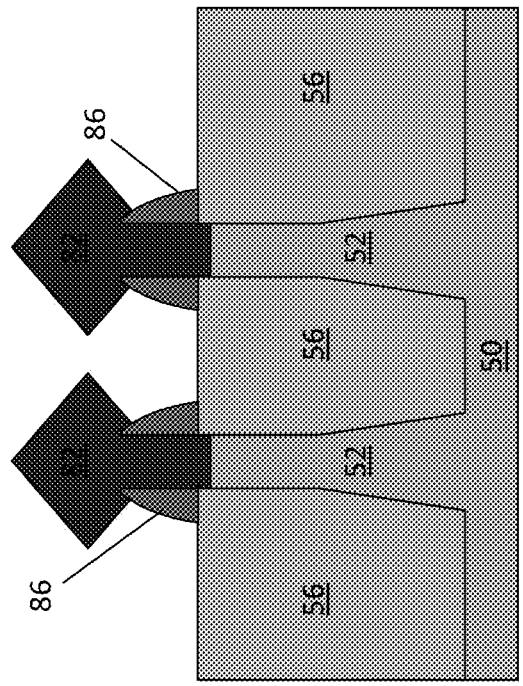
Figure 10D:
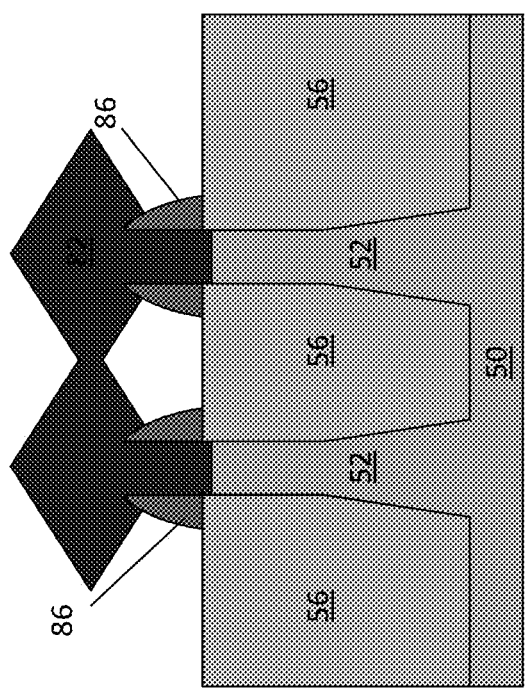

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
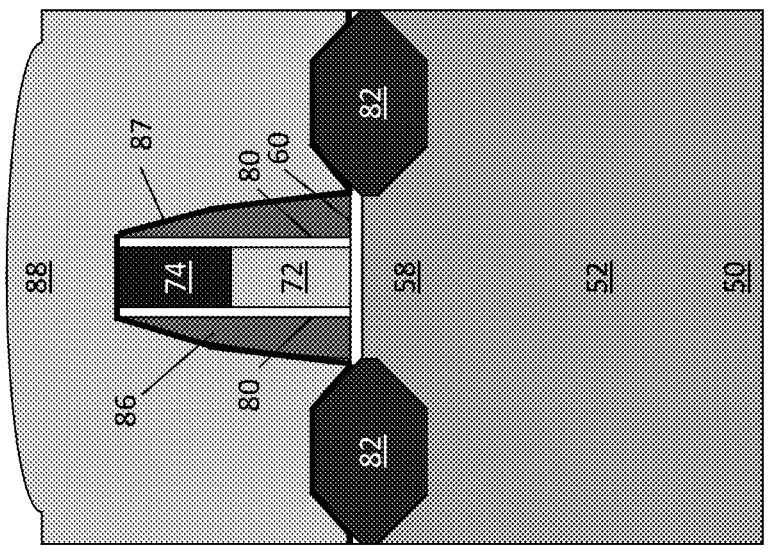
Figure 11A:
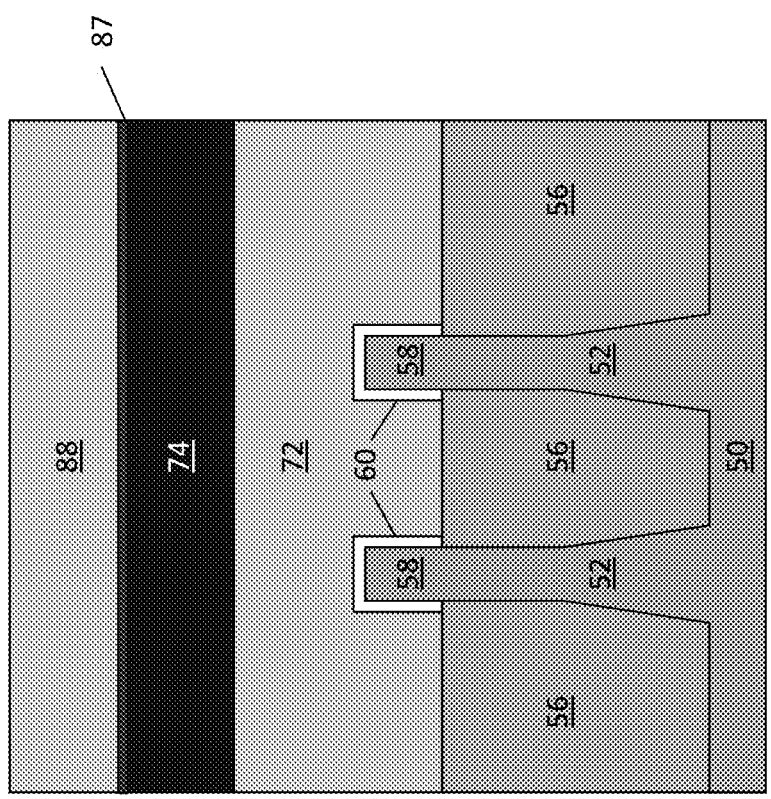

In FIGS. 11A and 11B, a first interlayer dielectric ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 12B:
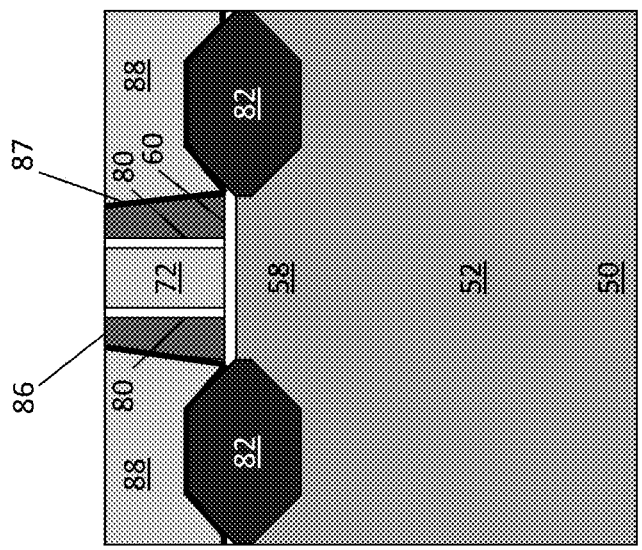
Figure 12A:
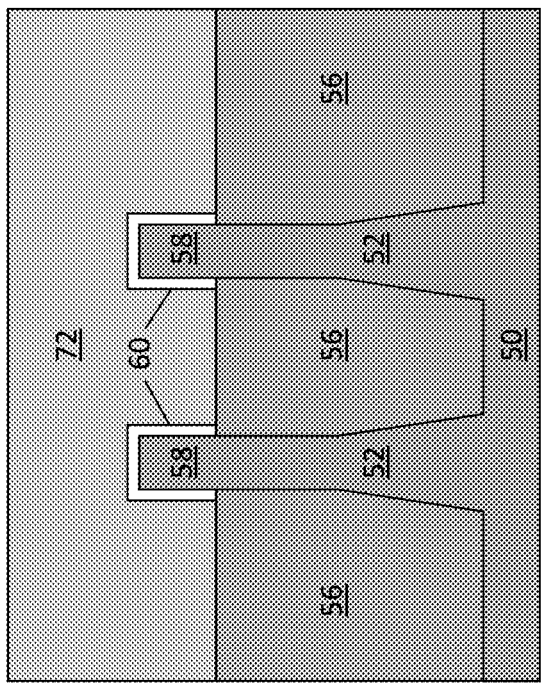

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
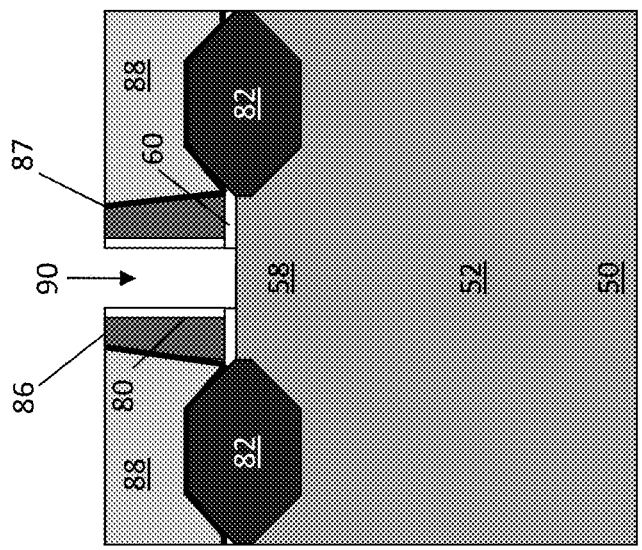
Figure 13A:
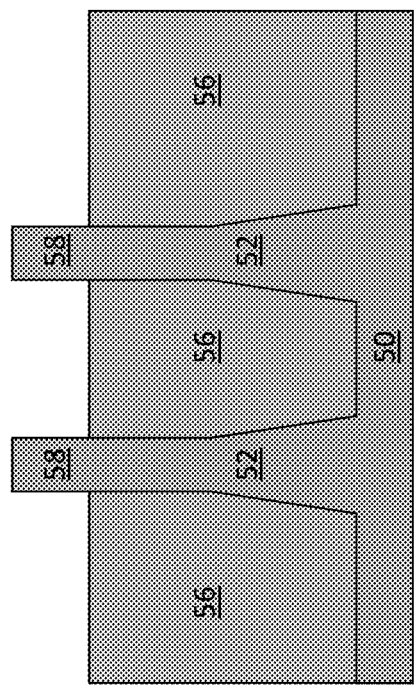

In FIGS. 13A and 13B, the dummy gate 72 (and the mask 74, if present) is removed in an etching step(s), so that recess 90 is formed. A wet chemical etch or a dry etch process (e.g., an anisotropic RIE) may be used. During the removal of the dummy gate 72, the dummy dielectric layer 60 may be used as an etch stop layer. In some embodiments, the etching process(es) may include etchants that selectively etch the dummy gate 72 (and the mask 74, if present) without significantly etching the first ILD 88, the CESL 87, or the gate spacers 86 and the gate-seal spacers 80. In some embodiments, such as the example illustrated in FIGS. 13A and 13B, a portion of the dummy dielectric layer 60 in the recess 90 is also removed using etchants that remove the dummy dielectric layer 60 at a higher etch rate than the channel region 58, the STI region 56, the first ILD 88, the gate spacers 86, and the gate-seal spacers 80. Removing a portion of the dummy dielectric layer 60 in the recess 90 exposes a channel region 58 of the respective fin 52. Each channel region 58 is disposed between neighboring pairs of the epitaxial source/drain regions 82.

It is understood that various structures, different from the example illustrated in FIGS. 13A and 13B, are possible. For example, in some other embodiments, only the dummy gates 72 may be removed and the dummy dielectric layer 60 remains and is exposed by the recesses 90. In some embodiments, the gate-seal spacers 80 may be removed along with the portion of the dummy dielectric layer 60.

FIGS. 14A through 14K illustrate the processing steps used to form the replacement gate structure (dielectric and conductive layers). The structure comprising the replacement gate dielectric and conductive layers is referred to as the final gate structure. The final gate structure of the NCFET and FE-FET FinFET described herein utilizes a gate dielectric stack comprising a non-ferroelectric gate dielectric layer and a ferroelectric gate dielectric layer formed over the channel regions 58. As explained above, a ferroelectric gate dielectric layer is included in the gate dielectric stack in order to generate a negative capacitance component of magnitude $C_{fe}$ that when combined with the capacitance $C_{nfe}$ of the non-ferroelectric gate dielectric layer helps increase the capacitance of the combined gate dielectric stack ($C_{ox}$) to realize a transistor with a steep subthreshold slope. The increase in $C_{ox}$ due to the negative capacitance component ($C_{fe}$) is understood from the following relationship: $1/C_{ox}=1/C_{nfe}-1/C_{fe}$, where $C_{fe}$ is the magnitude of the negative capacitance provided by the ferroelectric gate dielectric layer in accordance with its ferroelectric properties. A transistor with a steeper subthreshold slope may provide higher drive currents (e.g., higher $I_{ON}/I_{OFF}$ ratio) at the same power supply voltage ($V_{CC}$) or, alternatively, provide reduced active power consumption at the same switching speed by delivering the same drive currents (e.g., same $I_{ON}/I_{OFF}$ ratio) at a lower $V_{CC}$.

Figure 14B:
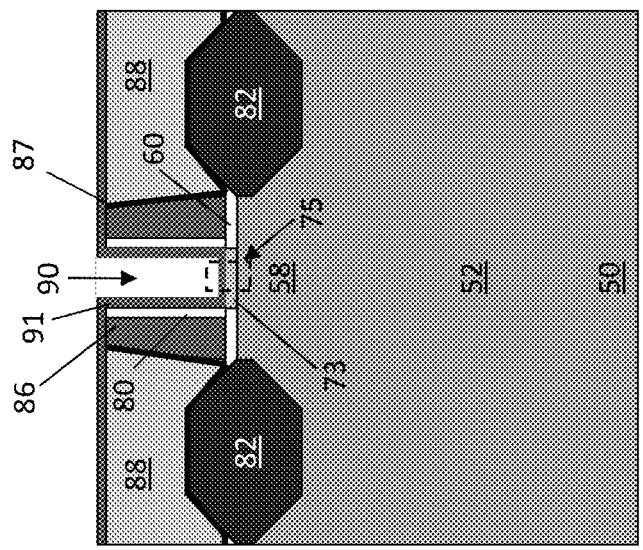
FIG. 14L is a graph showing one dimensional dopant profiles plotted along a cut through the center of the gate structure of NCFET FinFETs and FE-FETs, in accordance with some embodiments.
FIG. 14M is a graph showing the remanent polarization of ferroelectric gate dielectric layers of NCFET FinFETs and FE-FETs, corresponding to the dopant profiles plotted in FIG. 14L, in accordance with some embodiments.
Figure 14A:
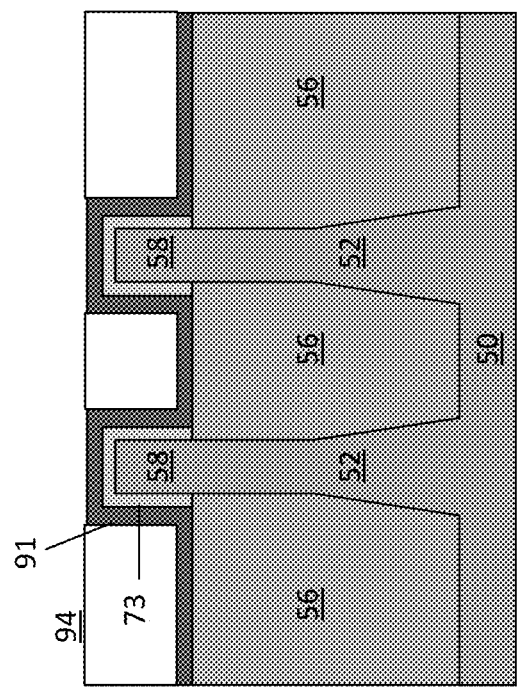

FIGS. 14A and 14B illustrate the replacement gate dielectric layers. Two dielectric layers are shown: an interfacial layer 73, which is the non-ferroelectric dielectric, and a ferroelectric gate dielectric layer 91. The ferroelectric gate dielectric layer 91 may be a high-k dielectric (e.g., a k value greater than that of silicon oxide), and in some embodiments, the ferroelectric gate dielectric layer 91 may have a dielectric constant k greater than about 7.0. As described in greater detail below, the processing used to form these layers may be adjusted to obtain the thicknesses and dielectric properties of the non-ferroelectric interfacial layer 73 and the ferroelectric gate dielectric layer 91 to provide the desired capacitance for the gate dielectric stack ($C_{ox}$) and $I_d$ vs. $V_g$ curves specified for a low standby power (low $I_{OFF}$) application.

The interfacial layer 73 in the embodiments illustrated in FIGS. 14A and 14B may be formed adjacent to the exposed surfaces (the sidewalls and the top surface) of the channel region 58 in recess 90 by chemically oxidizing the exposed semiconductor. Oxidizing the semiconductor of the channel region 58 exposed in the recess 90 may form a uniform oxide film over the exposed surface. In some embodiments, the semiconductor of the channel region 58 may be, for example, Si (or Ge) and the interfacial layer 73 may be, for example, $SiO_2$ (or $GeO_2$). In some embodiments, a thermal oxidation technique, such as, a rapid thermal oxidation (RTO) may be performed at a temperature from about 500° C. to about 1000° C. using dilute $O_2$ at a concentration of 0.01% to 50%.

In some embodiments, the exposed semiconductor (e.g. silicon) may be oxidized by a wet chemical method, such as immersing the wafer in dilute ozonated water ($DIO_3$) bath at a temperature from about 25° C. to about 80° C. The $O_3$ concentration may be between 1 ppm to 10 ppm. The oxidation conditions, for example, the temperature and/or the $O_2$ concentration used for the RTO process, or the bath temperature and/or the $O_3$ concentration for the $DIO_3$ process, may be adjusted to tune the thickness of the interfacial layer 73 from about 0.5 nm to about 2 nm. In some other embodiments (not shown), the interfacial layer 73 may be formed using techniques, for example, a CVD technique.

Also in FIGS. 14A and 14B, the ferroelectric gate dielectric layer 91 is shown conformally deposited, covering the top surfaces of the first ILD 88, the CESL 87, the gate spacers 86, and the gate-seal spacers 80 outside the recess 90. The ferroelectric gate dielectric layer 91 further extends inside the recess 90 over the sidewalls of the gate seal spacers 80, over the interfacial layer 73, and over the exposed surface of the STI region 56 outside the opposing sidewalls of the channel regions 58 of fins 52. In the embodiments described herein, the ferroelectric gate dielectric layer 91 in the final gate structure comprises a high-k ferroelectric dielectric, for example, orthorhombic-phase, polycrystalline $HfO_2$. In some embodiments, the crystalline phase of the ferroelectric material used for the ferroelectric gate dielectric layer 91 is stabilized using dopants. For example, the orthorhombic phase of $HfO_2$ may be stabilized by dopants such as Si, La, Zr, or the like, or combinations thereof. The dopants may be introduced into the $HfO_2$ using, for example, an alternating sequence of dielectric layers wherein adjacent dielectric layers alternate between a dopant-source layer and a high-k dielectric layer, e.g., an amorphous $HfO_2$ layer. After the alternating sequence of dielectric layers has been formed, a thermal treatment (e.g., a post-deposition anneal (PDA)) may be performed to incorporate the dopants substitutionally and convert the alternating sequence of dielectric layers to a stable ferroelectric gate dielectric layer 91. The ferroelectric properties of the ferroelectric gate dielectric layer 91 and, hence, $C_{fe}$ may be tuned by adjusting the processing parameters of the processes used in forming the dopant-source layers (e.g., an ALD or a PEALD deposition process) and in incorporating the dopants in the orthorhombic phase crystalline grains of the polycrystalline $HfO_2$ (e.g., the PDA process). In some embodiments, other dielectric materials such as $ZrO_2$ and $HfO_2$—$ZrO_2$ solid solution, and dopants such as Mg, Al, and Y may be used. Formation of the ferroelectric gate dielectric layer 91 is described in greater detail below with reference to a detailed view of the region 75 of FIG. 14B.

FIGS. 14C through 14G illustrate detailed cross-sectional views of the region 75 of FIG. 14B for several example embodiments in an intermediate process step used in the formation of the ferroelectric gate dielectric layer 91. In the examples illustrated in FIGS. 14C through 14G, an alternating sequence of dielectric layers 93 of a desired thickness in the range from about 1 nm to about 10 nm, for example 3 nm, has been formed over an interfacial layer 73 having a thickness in the range from about 0.5 nm to about 2 nm, for example, about 10 Å. The alternating sequence of dielectric layers 93 comprises a bottom high-k dielectric layer 77B (the layer shown adjacent to the interfacial layer 73) and one or more pairs of dielectric layers formed over the bottom high-k dielectric layer 77B, wherein one pair comprises a dopant-source layer 79 and a high-k dielectric layer 77 formed over the dopant-source layer 79. The high-k dielectric layer of the uppermost pair is assigned the numeral 77U and the high-k dielectric layer of any pair in between layers 77B and 77U is assigned the numeral 77I. Collectively, layers 77B, 77I, and 77U may be referred to as the high-k dielectric layer 77. The dopant-source layers 79 in the examples illustrated in FIGS. 14C through 14G may be of thickness in the range from about 0.5 Å to about 20 Å, for example 5 Å. Each embodiment in FIGS. 14C through 14G is distinguished by the locations at which the dopant source layers 79 are formed relative to the interfacial layer 73, as described in greater detail below.

The gate dielectric layer of the final NCFET and FE-FET device comprises the interfacial layer 73 and the ferroelectric gate dielectric layer 91. In embodiments using the ferroelectric gate dielectric layer 91, the thickness of interfacial layer 73 determines if the I-V and C-V characteristics of the final NCFET and FE-FET device are stable (e.g., hysteresis-free). If the interfacial layer 73 is less than 0.5 nm then the electrical characteristics may not be stable. If the interfacial layer 73 is greater than 5 nm then the total gate capacitance may be too low for the target transistor design.

Although the embodiments illustrated in FIGS. 14C through 14G use three high-k dielectric layers 77 and two dopant-source layers 79, it is understood that other embodiments may use a different number of the high-k dielectric layers 77 and/or a different number of the dopant-source layers 79. It is also understood that, although the first and last layers of the alternating sequence 93 of the embodiments illustrated in FIGS. 14C through 14G are both high-k dielectric layers 77, other embodiments may use an alternating sequence of dielectric layers 93 wherein the first layer and/or the last layer may be a dopant-source layer 79.

Referring first to FIG. 14C, the embodiment illustrated is the uniform-dopant alternating sequence of dielectric layers 93. In FIG. 14C two dopant-source layers 79 have been placed above the interfacial layer 73 at roughly equal intervals, along with three high-k dielectric layers 77B, 77I, and 77U, each about 0.05 nm to about 3 nm, for example 0.5 nm thick. The ratio of the thickness of each of the three roughly equally thick high-k dielectric layers 77B, 77I, and 77U to the total thickness of the alternating sequence of dielectric layers 93 is about 0.005 to about 0.3, for example 0.2.

The embodiment illustrated in FIG. 14D is the top-dopant alternating sequence of dielectric layers 93. In FIG. 14D, two closely-spaced dopant-source layers 79 have been formed near a top (away from the interfacial layer 73) of the alternating sequence of dielectric layers 93 by forming a relatively thick bottommost high-k dielectric layer 77B having a thickness in the range from about 0.5 nm to about 5 nm, for example 1 nm. The ratio of the thickness of the bottommost high-k dielectric layer 77B to the total thickness of the alternating sequence of dielectric layers 93 is roughly from about 0.5 to about 0.9, for example 0.7. A thickness of the intermediate high-k dielectric layer 77I, the one being shown in FIG. 14D, may be roughly equal to the thickness of the uppermost high-k dielectric layer 77U. The thickness of each of the high-k dielectric layers 77I and 77U may be about 0.05 nm to about 2 nm, for example 0.5 nm. The ratio of the thickness of each of the high-k dielectric layers 77I and 77U to the total thickness of the alternating sequence of dielectric layers 93 is roughly about 0.01 to about 0.3, for example 0.1.

The embodiment illustrated in FIG. 14E is the middle-dopant alternating sequence of dielectric layers 93. In FIG. 14E, the two dopant-source layers 79 are shown spaced by a relatively thin intermediate high-k dielectric layer 77I and disposed roughly symmetrically about the center of the alternating sequence of dielectric layers 93. The thickness of a relatively thin intermediate high-k dielectric layer 77I used to space the two dopant-source layers 79 may be in the range from about 0.05 nm to about 2 nm, for example 0.5 nm. The ratio of the thickness of the intermediate high-k dielectric layer 77I to the total thickness of the alternating sequence of dielectric layers 93 is roughly from about 0.01 to about 0.3, for example 0.1. In the example illustrated in FIG. 14E, the thicknesses of the high-k dielectric layers 77B and 77U are roughly equal and each may be about 0.2 nm to about 4 nm, for example 1 nm. The ratio of the thickness of each of the high-k dielectric layer 77B and 77U to the total thickness of the alternating sequence of dielectric layers 93 is about 0.2 to about 0.4, for example 0.3.

The embodiment illustrated in FIG. 14F is the bottom-dopant alternating sequence of dielectric layers 93. In FIG. 14F, two closely-spaced dopant-source layers 79 are located close to the interfacial layer 73 by forming a relatively thin bottommost high-k dielectric layer 77B having a thickness in the range from about 0.05 nm to about 2 nm, for example 1 nm. The ratio of the thickness of the bottommost high-k dielectric layer 77B to the total thickness of the alternating sequence of dielectric layers 93 is roughly from about 0.05 to about 0.3, for example 0.1. A thickness of an intermediate high-k dielectric layer 77I positioned between the two closely-spaced dopant-source layers 79 may be in the range from about 0.05 nm to about 2 nm, for example 0.5 nm. The ratio of the thickness of the intermediate high-k dielectric layer 77I between the two closely-spaced dopant-source layers 79 to the total thickness of the alternating sequence of dielectric layers 93 is roughly from about 0.05 to about 0.3, for example 0.1. A relatively thick uppermost high-k dielectric layer 77U having a thickness in the range from about 0.5 nm to about 5 nm, for example 2 nm has been formed over the dopant source layers, in the example illustrated in FIG. 14F. The ratio of the thickness of the uppermost high-k dielectric layer 77U to the total thickness of the alternating sequence of dielectric layers 93 is roughly from about 0.5 to about 0.9, for example 0.7.

The embodiment illustrated in FIG. 14G is the edge-dopant alternating sequence of dielectric layers 93. In FIG. 14G, the dopant-source layers are placed near the two edges of the alternating sequence of dielectric layers 93 by forming relatively thin bottom and top high-k dielectric layers 77B and 77U, and a relatively thick intermediate high-k dielectric layer 77I in between the two dopant-source layers 79. The thicknesses of the high-k dielectric layers 77B and 77U are roughly equal and may be in the range from about 0.05 nm to about 2 nm, for example 0.5 nm. The ratio of the thickness of each of the high-k dielectric layers 77B and 77U to the total thickness of the alternating sequence of dielectric layers 93 is roughly from about 0.05 to about 0.3, for example 0.1. The thickness of the relatively thick intermediate high-k dielectric layer 77I used to space the two dopant-source layers 79 may be in the range from about 0.5 nm to about 9 nm, for example 2 nm. The ratio of the thickness of the high-k dielectric layer 77I to the total thickness of the alternating sequence of dielectric layers 93 is roughly from about 0.5 to about 0.9, for example, 0.7.

Analyses of embodiments fabricated in accordance with the examples described with reference to FIGS. 14C through 14G indicate that the dopant concentration profile and the ferroelectric properties of the ferroelectric gate dielectric layer 91 may be altered by adjusting the locations of the dopant-source layers 79 in the alternating sequence of dielectric layers 93, as discussed below with reference to FIGS. 14L and 14M.

Still referring to FIGS. 14C through 14G, a sequence of dielectric layers alternating between a high-k dielectric layer (e.g., an amorphous $HfO_2$ layer) 77 and a dopant-source layer 79 has been deposited over the interfacial layer 73 using, for example, CVD, ALD, plasma-enhanced ALD (PEALD), or the like, or a combination thereof. The dopant-source layer 79 may comprise a material such as $SiO_x$, $La_yO_x$, or $Zr_yO_x$ for a source of the dopants Si, La, and Zr, respectively, as examples.

In some embodiments such as embodiments utilizing an ALD technique to form the alternating sequence of dielectric layers 93, a hydroxylated starting surface terminated with H atoms may be prepared prior to depositing the first high-k dielectric layer 77 (e.g., an amorphous $HfO_2$ layer). Each ALD reaction cycle used to deposit the high-k dielectric layers 77 comprises, for example, two reaction pulses with a purge performed after each reaction pulse. During the first reaction pulse, a first precursor gas such as $HfCl_4$ or a hafnium alkylamide, for example, tetrakis(ethylmethylamido)hafnium $Hf(NMeEt)_4$ (TEMAH), tetrakis(dimethylamido)hafnium $Hf(NMe_2)_4$ (TDMAH), or tetrakis(diethylamido)hafnium ($Hf(NEt_2)_4$) may be used as a source of the Hf atoms needed to form $HfO_2$. The Hf-source gas may be introduced into a reaction chamber at a flow rate of about 100 sccm to about 10000 sccm along with a carrier gas $N_2$, Ar, He at a flow rate of about 100 sccm to about 10000 sccm for a duration of about 0.1 s to about 60 s. The chamber may be at a pressure of about 1 Torr to about 10 Torr and a temperature of about 200° C. to about 400° C. A surface-gas reaction takes place whereby Hf from the precursor gas replaces the surface atoms, and the new surface is terminated with pairs of ligands from the precursor molecule (e.g., pairs of (NMeEt) if TEMAH is the precursor), each pair binding to one Hf atom.

A first purge pulse for a duration of about 0.1 s to about 60 s may be performed using, for example, a purge gas $N_2$, Ar, or He, at a flow rate of about 100 sccm to about 10000 sccm to remove by-products and excess Hf-source precursor gas from the chamber.

The first purge pulse is followed by the second reaction pulse of the ALD reaction cycle during which a second precursor gas such as $O_3$, $O_2$, $H_2O$, or $D_2O$ may be introduced into the reaction chamber to provide the O atoms needed to form $HfO_2$. In some embodiments, the O-source gas may be introduced at a flow rate of about 100 sccm to about 10000 sccm along with a carrier gas $N_2$, Ar, or He at a flow rate of about 100 sccm to about 10000 sccm for a duration of about 0.1 s to about 60 s. The chamber may be at a pressure of about 1 Torr to about 10 Torr and a temperature of about 200° C. to about 400° C. The surface-gas reaction with the second precursor gas detaches the ligands at the surface from the Hf atom. In embodiments using $H_2O$ or $D_2O$, the free ligands binds with hydrogen (e.g., H(NMeEt) or D(NMeEt)) forming a gaseous by-product, and the OH (or OD) from the $H_2O$ (or $D_2O$) binds with Hf to generate a new hydroxylated surface terminated with H atoms. In embodiments using $O_3$ or $O_2$, the detached ligands undergo further oxidation reactions to form final by-products such as $H_2O$, $CH_2O$, $CO_2$, NO, $NO_2$, etc. The hydroxyls (OH) present in the by-product $H_2O$ may re-hydroxylate the surface. For example, in some embodiments, the second reaction pulse includes introducing $O_3$ at a flow rate of about 500 sccm to about 10000 sccm along with a carrier gas $N_2$ or Ar, for a duration of about 1 s to about 20 s. The chamber may be at a pressure of about 1 Torr to about 10 Torr and a temperature of about 200° C. to about 400° C. In this embodiment, $N_2$ or Ar may also be used as a purge gas.

A second purge pulse, similar to the first purge pulse described above, may be performed to remove by-products and excess O-source gas from the reaction chamber.

The ALD reaction cycle described above, for example, a first reaction pulse using a first precursor gas (Hf-source gas), a first purge pulse, a second reaction pulse using a second precursor gas (O-source gas), and a second purge pulse, may be repeated any number of times to form a high-k dielectric layer (e.g., an amorphous $HfO_2$ layer) 77 having a desired thickness.

In some embodiments, a PEALD process may be used to form the high-k dielectric layers (e.g., amorphous $HfO_2$ layers) 77. For example, a first reaction pulse and a first purge pulse of the PEALD process may be performed using gases and processing parameters similar to those described above for the thermal ALD process.

During the second reaction pulse of the PEALD reaction cycle the O-source precursor gas may be introduced with a direct plasma or remote plasma. The RF power may be about 10 W to about 2000 W at a frequency of about 10 MHz to about 20 MHz, and a DC bias of about 0 V to about 100 V may be used. The plasma may use $O_3$, $O_2$, $H_2O$, or $D_2O$ as the process gas introduced at a flow rate of about 100 sccm to about 10000 sccm along with a carrier gas Ar, He at a flow rate of about 100 sccm to about 10000 sccm for a duration of about 0.1 s to about 60 s. The chamber may be at a pressure of about 1 Torr to about 10 Torr. The reactivity of the oxidizing species is increased by the plasma so that the chamber temperature for the PEALD processes may be reduced relative to that for the thermal ALD process described above. For example, the range of temperature for the PEALD process may be from about 100° C. to about 400° C.

A second purge pulse, similar to the first purge pulse described above, may be performed to remove by-products and excess O-source gas from the reaction chamber.

In embodiments using PEALD, it may also be possible to use metal-organic Hf-precursors as a first precursor gas (instead of a first precursor gas such as HfCl4 or a hafnium alkylamide) because of the reduced processing temperatures. For example, HyALD $CpHf(NMe_2)_3$, where Cp denotes the cyclopentadienyl ring, may be used during the first reaction pulse.

The dopant-source layers 79 may also be formed using an ALD process. For example, a dopant-source layer 79 may be formed by utilizing an ALD reaction cycle where the first precursor gas may provide the dopant atoms of the dopant-source layer 79 (e.g., a Si-source gas, a La-source gas, or a Zr-source gas). The precursor for Si-dopant may be $SiCl_4$, $SiH_4$, $C_6H_{17}NSi$ (LTO520), $Si_2H_6$, or the like. The precursor for La-dopant may be $La(C_5H_5)_3$, $La(C_{11}H_{19}O_2)_3(La(thd)_3)$, $C_{21}H_{45}LaN_6$ ($La(FMD)_3$), or the like. The precursor for Zr-dopant may be $ZrCl_4$, $Zr(C_5H_5)(N(CH_3)_2)_3Zr$ $(NCH_3C_2H_5)_4$ (TEMAZ), $[(CH_3)_2N]_4Zr$ (TDMAZ), or the like. The first reaction pulse may be of duration 0.1 s to about 60 s during which a dopant-precursor gas may be introduced into a reaction chamber at a flow rate of about 100 sccm to about 10000 sccm along with a carrier gas $N_2$, Ar, He at a flow rate of about 100 sccm to about 10000 sccm during a reaction pulse of duration 0.1 s to about 60 s. The chamber may be at a pressure of about 1 Torr to about 10 Torr and a temperature of about 200° C. to about 400° C.

The first reaction pulse of the ALD process may be followed by a purge pulse and the purge may be followed by a second reaction pulse during which a second precursor gas such as, $O_3$, $O_2$, $H_2O$, or $D_2O$, may be introduced into the reaction chamber to provide an O-source needed for a surface-gas reaction to form a monolayer of dopant-oxide. The second reaction pulse may be of duration 0.1 s to about 60 s during which the O-source gas may be introduced into a reaction chamber at a flow rate of about 100 sccm to about 10000 sccm along with a carrier gas $N_2$, Ar, He at a flow rate of about 100 sccm to about 10000 sccm during a reaction pulse duration of 0.1 s to about 60 s. After the second reaction pulse, another purge process may be performed to complete one reaction cycle, as discussed above.

In some embodiments, a PEALD process may be used to form the dopant-source layers 79. For example, a first reaction pulse and a first purge pulse of the PEALD process may be performed using gases and processing parameters similar to those described above for the thermal ALD process.

During the second reaction pulse of the PEALD reaction cycle the O-source precursor gas may be introduced with a direct plasma or remote plasma, in accordance with some embodiments. The RF power may be about 10 W to about 2000 W at a frequency of about 10 MHz to about 20 MHz, and a DC bias of about 0 V to about 100 V may be used. The plasma may use $O_3$, $O_2$, $H_2O$, or $D_2O$ as the process gas introduced at a flow rate of about 100 sccm to about 10000 sccm along with a carrier gas, such as Ar or He, at a flow rate of about 100 sccm to about 10000 sccm for a duration of about 0.1 s to about 60 s. The chamber may be at a pressure of about 1 Torr to about 10 Torr. The reactivity of the oxidizing species is increased by the plasma so that the chamber temperature for the PEALD processes may be reduced relative to that for the thermal ALD process described above. For example, the range of temperature for the PEALD process may be from about 100° C. to about 400° C.

In embodiments using PEALD, it may also be possible to use additional precursors for dopants (e.g., $H_2Si[N(C_2H_5)_2]_2$ (SAM24) for Si-dopant, $La(C_3H_7C_5H_4)_3$ (La(iPrCp)$_3$) for La-dopant, and (ZyALD) for Zr-dopant).

In some embodiments, more than one dopant species may be used. The thicknesses of each of the dopant-source layers 79 and of each of the high-k dielectric layers 77 may be accurately controlled by controlling the number of ALD/PEALD dopant reaction cycles and $HfO_2$ reaction cycles performed during the formation of each respective layer. The physical location of a dopant source layer 79 may be precisely controlled by inserting the requisite number of dopant reaction cycles in between $HfO_2$ reaction cycles at the proper location in the sequence of ALD (and/or PEALD) reaction cycles used to form the alternating sequence of dielectric layers 93.

In FIG. 14H a post-deposition anneal (PDA) is performed after the deposition of the alternating sequence of dielectric layers 93 has been completed. In some embodiments, the PDA is performed in a $N_2$ ambient or a dilute-oxygen ambient. The PDA may be a rapid thermal anneal (RTA) at a temperature of about 600° C. to about 1100° C. for a soak time of about 10 s to about 10 min, or a spike anneal at a temperature of about 750° C. to about 1100° C. The PDA may be utilized to convert the non-ferroelectric alternating sequence of dielectric layers 93 to a ferroelectric gate dielectric layer 91. For example, in some embodiments, the PDA may crystallize the amorphous $HfO_2$ layers 77 and stabilize the phase of the crystalline grains to an orthorhombic-phase, polycrystalline $HfO_2$ by incorporating the dopant atoms from the dopant source layers 79 into the $HfO_2$ crystal as the amorphous $HfO_2$ crystallizes during the PDA. In some embodiments, a ratio of the number of dopant atoms incorporated in the ferroelectric gate dielectric layer 91 to the total number of atoms present in the ferroelectric gate dielectric layer 91 may be about 0.5% to about 30% for Si dopants, about 0.5% to about 50% for La dopants, and about 5% to about 80% for Zr dopants to provide a stable ferroelectric gate dielectric layer 91. A ratio of dopant atoms less than these amounts may be insufficient to stabilize the orthorhombic-phase, polycrystalline $HfO_2$, thereby reducing the ferroelectric properties of the material. A ratio of dopant atoms greater than these amounts may reduce the fraction of the polycrystalline $HfO_2$ material that is stabilized in the orthorhombic phase; thereby reduce a remanent polarization ($P_R$) of the ferroelectric gate dielectric layer 91. The reduced $P_R$ may result in an insufficient negative capacitance of magnitude $C_{fe}$.

The thickness of the ferroelectric gate dielectric layer 91 may be about 1 nm to about 10 nm. If the thickness of the ferroelectric gate dielectric layer 91 is less than 1 nm then the gate dielectric of the final NCFET and FE-FET device may have high leakage and/or low time-dependent dielectric breakdown (TDDB) lifetime. If the thickness of the ferroelectric gate dielectric layer 91 is greater than 10 nm then the total gate capacitance may be too low for the target transistor design. In embodiments wherein ALD or PEALD is used in forming the ferroelectric gate dielectric layer 91, this thickness is precisely controlled. In addition to altering the location of the dopant source layers, the final dopant concentration profile and the ferroelectric properties may be tuned by varying the PDA processing parameters, for example, the thermal budget.

Figure 14J:
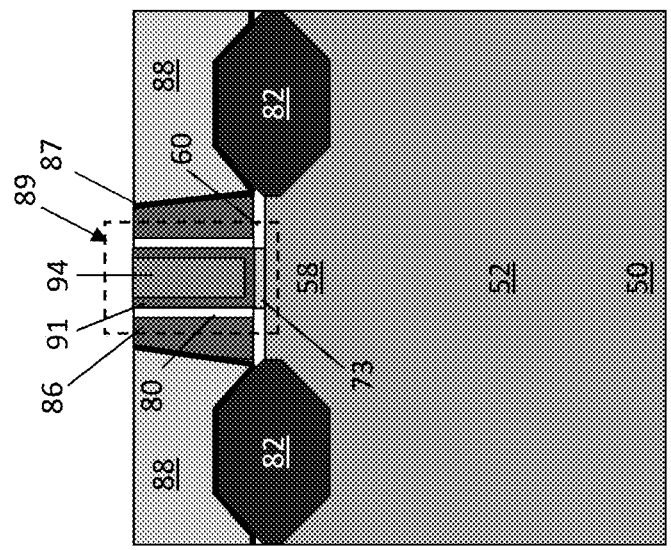
Figure 14I:
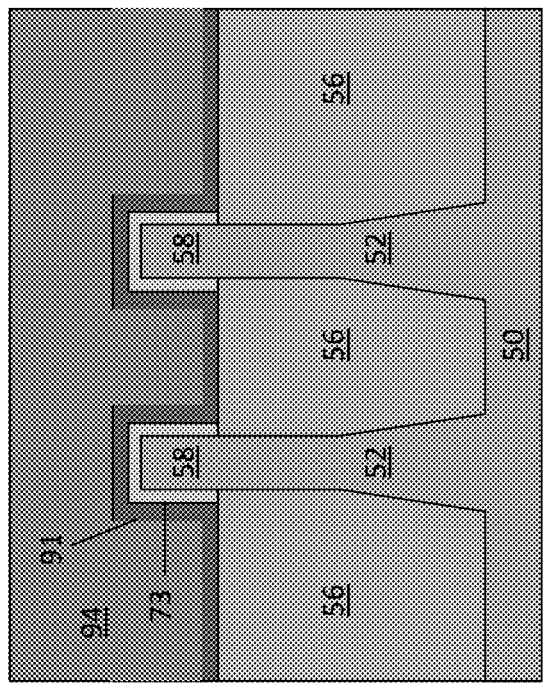

FIGS. 14I and 14J further illustrate a gate electrode 94. The gate electrode 94 is deposited over the ferroelectric gate dielectric layer 91, and fills the remaining portion of the recess 90. After the gate recess 90 is filled, a planarization process, such as a CMP, may be performed to remove the excess portions of the ferroelectric gate dielectric layer 91 and the materials of the gate electrodes 94 from over the top surface of the ILD 88. FIGS. 14I and 14J, illustrate the gate structure after the planarization step is completed. FIG. 14J illustrates the inlaid gate electrode 94 between two gate seal spacers 80 in a cross-sectional image of a FinFET along a longitudinal axis of a fin 52 (the axis B-B shown in FIG. 1). FIG. 14I illustrates the gate structure over two fins 52 and STI regions 56 in a cross-sectional image of a FinFET along a longitudinal axis of a gate electrode 94 (the axis A-A shown in FIG. 1). In FIG. 14I, the gate structure comprising the interfacial layer 73, the ferroelectric gate dielectric layer 91, and gate electrodes 94 is shown extending over the top surface and along sidewalls of a channel region 58 of the fins 52. The ferroelectric gate dielectric layer 91 and the gate electrode 94 may extend further over the STI regions 56 outside the opposing sidewalls of the channel regions 58 of fins 52, in accordance with some embodiments.

Figure 14K:
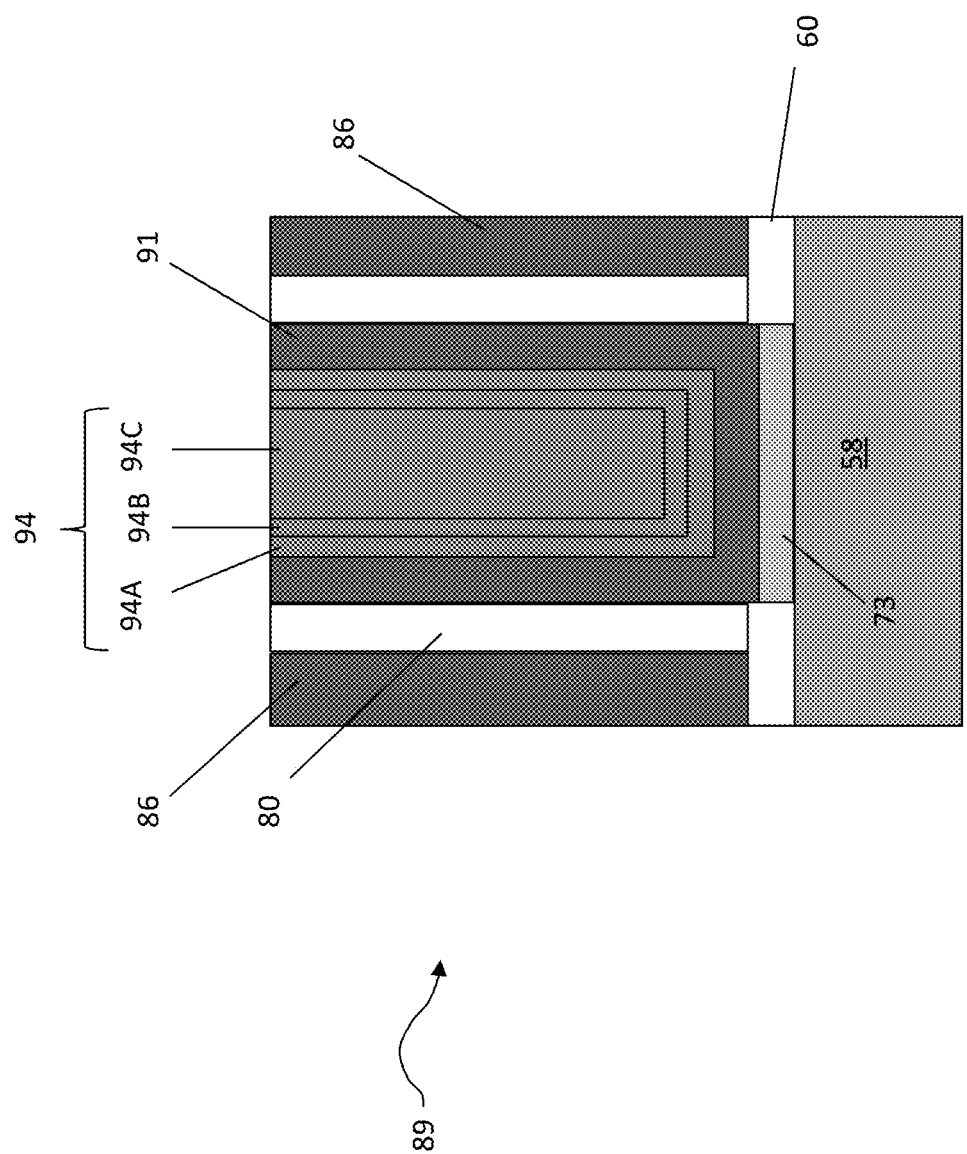

FIG. 14K illustrates a detailed view of region 89 of FIG. 14J. As illustrated in FIG. 14K, the gate electrode 94 may include a metal-containing material such as TiN, $Ti_xSi_yN$, TiO, TaN, $Ta_xSi_xN$, TaC, Co, Ru, Al, W, combinations thereof, or multi-layers thereof. For example, although a single layer gate electrode 94 is illustrated in FIG. 14J, the gate electrode 94 may comprise any number of cap layers (also known as liner layers) 94A, any number of work function tuning layers 94B, and a fill material 94C as illustrated by FIG. 14K. An optional post-cap anneal may be performed after depositing the cap layers 94A. In some embodiments, wherein the alternating sequence of dielectric layers 93 is relatively thick (e.g., more than 3 nm), the PDA step may be optional and the post-cap anneal may be used to convert the non-ferroelectric alternating sequence of dielectric layers 93 to a ferroelectric dielectric layer 91.

In some embodiments, the formation of the ferroelectric gate dielectric layers 91 in the region 50N and the region 50P may occur simultaneously such that the ferroelectric gate dielectric layer 91 in each region is formed from the same materials, but the gate electrode 94 may be formed by distinct processes, such that the gate electrode 94 may comprise different materials to accommodate different work functions required of the respective gate electrodes 94 of NMOS and PMOS transistors. In some embodiments, various other combinations of same/distinct processes may be used to form the ferroelectric gate dielectric layer 91 and/or the gate electrode 94 in each region. Various masking steps may be used to mask and expose appropriate regions when using distinct processes.

Figure 14M:
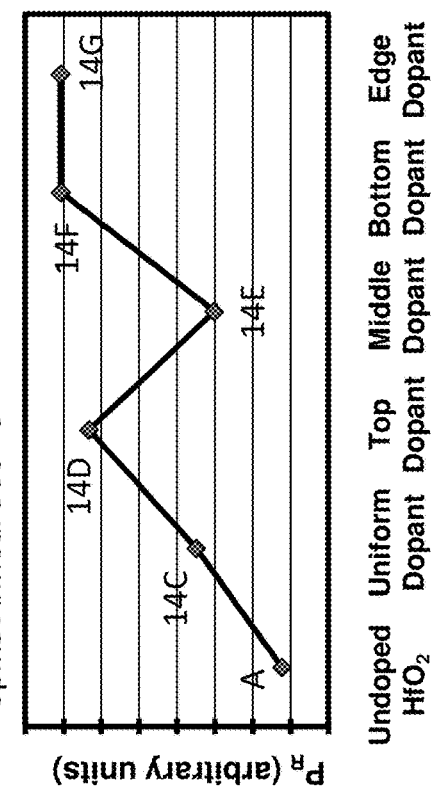
Figure 14L:
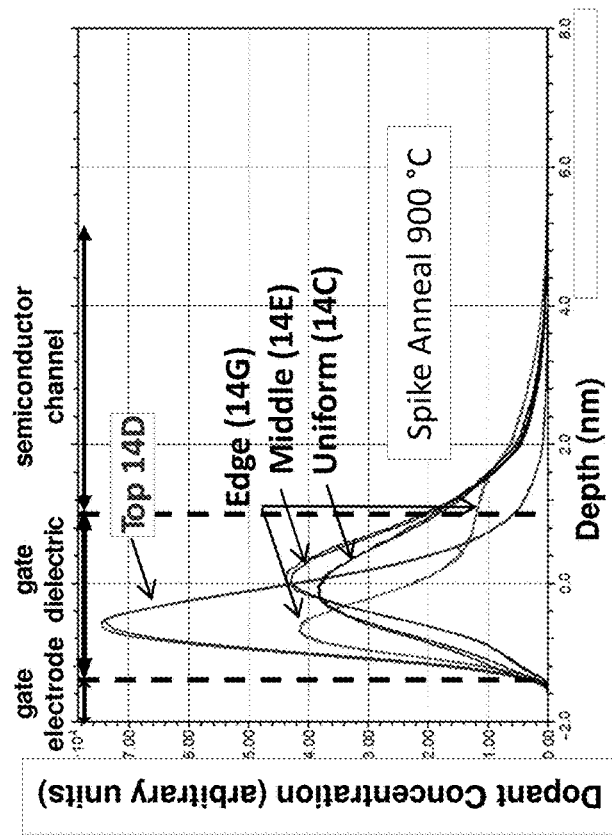

FIG. 14L illustrates five one-dimensional dopant concentration profiles corresponding to the five example embodiments described with reference to FIGS. 14C through 14G. The respective dopant concentration profiles are labeled as 14C-14G in FIG. 14L. The five sample dopant concentration profiles shown in FIG. 14L are of Si dopants incorporated in the ferroelectric gate dielectric layer 91 (see FIGS. 14H through 14J) and have been formed using the same PDA processing conditions, for example, a spike anneal at a temperature of about 900° C. In FIG. 14L, the dopant concentration profiles are plotted vs. depth in a direction perpendicular to the current flow between source/drain regions. The depth is increasing in the direction from the gate electrode 94 to the semiconductor channel region 58 of the NCFET FinFETs illustrated in FIGS. 14I and 14J. The horizontal arrows in FIG. 14L indicate roughly the locations of the gate electrode 94, the gate dielectric stack (e.g., the ferroelectric gate dielectric layer 91 and the non-ferroelectric interfacial layer 73), and the semiconductor channel region 58. The profiles may be confirmed by, for example, energy dispersive X-ray analysis (EDS) and electron energy loss spectroscopy using the electron beam of a transmission electron microscope (TEM).

The data illustrated in FIG. 14L indicate that the dopant profiles may be varied in accordance with the placement of the dopant source layers 79. For example, the position of the peak dopant concentration within the gate dielectric stack may be varied between the various embodiments illustrated in FIGS. 14C-14G. The dopant profiles corresponding to the top-dopant and the edge-dopant alternating sequence of dielectric layers 93 (see FIGS. 14D and 14G) may exhibit a peak close to the top interface of the gate dielectric stack (the interface between the gate electrode 94 and the ferroelectric gate dielectric layer 91). The embodiments using either the uniform-dopant alternating sequence of dielectric layers 93 (see FIG. 14C) or the middle-dopant alternating sequence of dielectric layers 93 (see FIG. 14E) have dopant profiles that peak near the center of the gate dielectric stack.

The dopant profile in a ferroelectric gate dielectric layer 91 fabricated using the methods described in this disclosure may have a relatively high dopant concentration gradient. In some embodiments, such as in the dopant concentration profiles illustrated in FIG. 14L, the dopant concentration rises from half of its maximum value to the peak and drops back down to half of the maximum value within a short distance, referred to as the full width at half maximum (FWHM) of the dopant concentration profile. In the example illustrated in FIG. 14L, the thickness the gate dielectric stack comprising the ferroelectric gate dielectric layer 91 and the non-ferroelectric interfacial layer 73 is roughly 2.4 nm, and the FWHM of the dopant concentration distributions are roughly 1.8 nm, 0.98 nm, 1.5 nm, and 1.1 nm corresponding to the uniform-dopant, top-dopant, middle-dopant, and edge-dopant alternating sequence of dielectric layers 93, respectively. In some embodiments, the FWHM of the dopant concentration profile in the ferroelectric gate dielectric layer 91 may be about 0.3 nm to about 3 nm and the peak dopant concentration may be from about $10^{13}$ cm$^{-2}$ to about $10^{15}$ cm$^{-2}$. In some embodiments, a dopant concentration along a surface of the interfacial layer adjacent the semiconductor channel 58 may be in a range from about $1\times10^{13}$ cm$^{-2}$ to about $1\times10^{15}$ cm$^{-2}$.

The embodiment using the edge-dopant alternating sequence of dielectric layers 93 (see FIG. 14G) shows two distinct regions where the plot of dopant concentration vs. depth is convex (a double-hump dopant profile). At any depth, the curvature of a plot of dopant concentration vs. depth is referred to as convex (or concave) if, at that depth, the plot appears convex (or concave) when viewed from the top downwards. For example, the curvature in the vicinity of a maximum is convex, whereas the curvature in the vicinity of a minimum is concave. Although the dopant-source layers in the edge-dopant embodiment have been positioned roughly symmetrically around the center of the alternating sequence of dielectric layers 93 (see FIG. 14G), the respective dopant-profile 14G in FIG. 14L is asymmetric with the majority of the dopants being incorporated in the upper portion of the ferroelectric gate dielectric layer 91 (the portion further from the interfacial layer 73).

FIG. 14L shows that, in some embodiments, the dopant profiles of the ferroelectric dielectric layer 91 may be varied in accordance with the location of the dopant-source layers, for example by altering the sequence of reaction pulses used to form the alternating sequence of dielectric layers 93. FIG. 14M illustrates that the electrical properties of the ferroelectric dielectric layer 91 are modulated by the respective variation in the dopant profiles. For example, FIG. 14M illustrates the difference in ferroelectric properties of the ferroelectric gate dielectric layer 91 achieved by varying the locations of the dopant source layers 79 during the formation of the alternating sequence of dielectric layers 93, such as the various examples of alternating sequence of dielectric layers 93 illustrated in FIGS. 14C through 14G. The ferroelectric property being compared in the chart in FIG. 14M is the remanent polarization ($P_R$) of the ferroelectric gate dielectric layer 91. Generally, the electric polarization (P) in a dielectric material is a function of the electric field (E). Ordinarily, P=0 at E=0, but in a ferroelectric dielectric layer, the P vs. E curve is nonlinear and has a hysteresis loop wherein P≠0 at E=0. The electric polarization at zero electric field is referred to as $P_R$. A reverse electric field, referred to as the coercive field ($E_C$), is applied to force P to zero. The polarity of $P_R$ (and $E_C$) on the increasing branch of the hysteresis is opposite to the respective polarity on the decreasing branch. This $P_R$ provides a negative capacitance and, hence, a steeper subthreshold slope and $I_{ON}/I_{OFF}$ ratio. Accordingly, it may be desirable to select an embodiment wherein the locations of the dopant-source layers 79 provide a high value for $P_R$, in accordance with the desired electrical characteristics. As described in detail above, the dopant-source layers may be positioned precisely and their positions may be controlled with atomic level accuracy by the sequence in which the dopant reaction cycles and the HfO$_2$ reaction cycles are performed in the sequence of ALD (and/or PEALD) reaction cycles used to form the alternating sequence of dielectric layers 93. This may help reduce variability in electrical behavior of the devices and thereby improve manufacturing yield.

FIG. 14M illustrates the different values of $P_R$ corresponding to the five example embodiments in FIGS. 14C through 14G. The respective dopant profiles and values of $P_R$ are labeled as 14C-14G in FIGS. 14L and 14M. In addition, a sixth value of $P_R$ (labeled as point A in FIG. 14M) is shown that corresponds to an undoped $HfO_2$ layer formed using identical processing, except the sequence of ALD (and/or PEALD) reaction cycles used to deposit the corresponding dielectric layer would be exclusively $HfO_2$ reaction cycles. Accordingly, no dopant-source layer 79 would be present during the PDA process. A comparison between the $P_R$ labeled as A with the $P_R$ values labeled as 14C-14G in FIG. 14M indicates that the $P_R$ of the ferroelectric gate dielectric layer 91 may be increased by including dopants in the polycrystalline $HfO_2$ layer to stabilize the grains in the orthorhombic crystalline phase increases. This, in turn, provides a steeper subthreshold slope and $I_{ON}/I_{OFF}$ ratio, as stated above. The results illustrated in FIG. 14M further indicate that positioning the dopant-source layers 79 in the alternating sequence of dielectric layers 93 may be used to adjust the ferroelectric properties (e.g., $P_R$ and $E_C$) of the ferroelectric gate dielectric layer 91. For example, the $P_R$ values labeled as 14C and 14E (corresponding to the uniform-dopant and middle-dopant embodiments illustrated in FIGS. 14C and 14E, respectively) are lower than those labeled 14D, 14F, and 14G (corresponding to the top-dopant, bottom-dopant, and edge-dopant embodiments illustrated in FIGS. 14D, 14F, and 14G, respectively).

In some embodiments, $P_R$ of the ferroelectric gate dielectric layer 91 in the final NCFET and FE-FET device may be varied from about 0.1 $\mu C/cm^2$ to about 10 $\mu C/cm^2$ by adjusting the physical locations of the dopant-source layers 79 in the alternating sequence of dielectric layers 93. The physical locations and thicknesses of the dopant-source layers 79 may be controlled with high precision during fabrication by utilizing ALD and/or PEALD techniques in depositing the dopant-source layers 79 and the high-k gate dielectric layers 77. As illustrated in FIG. 14M, embodiments such as those illustrated in FIGS. 14D, 14F, and 14G may exhibit a higher $P_R$ as compared to the embodiments illustrated in FIGS. 14C and 14E. A comparison between the respective two groups of dopant profiles in FIG. 14L, one group comprising 14D, 14F, and 14G and the other group comprising 14C and 14E, suggests that a non-uniform dopant profile wherein a majority of dopants are disposed away from the center of the ferroelectric gate dielectric layer 91 provides a higher $P_R$. A higher $P_R$ may potentially provide a more negative capacitance and, hence, a steeper subthreshold slope and $I_{ON}/I_{OFF}$ ratio, as described above. The control over the ferroelectric properties achieved by precise control of the locations dopant-source layers 79 may be advantageous in designing for stable NCFETs with improved turn-off characteristics.

Figure 15B:
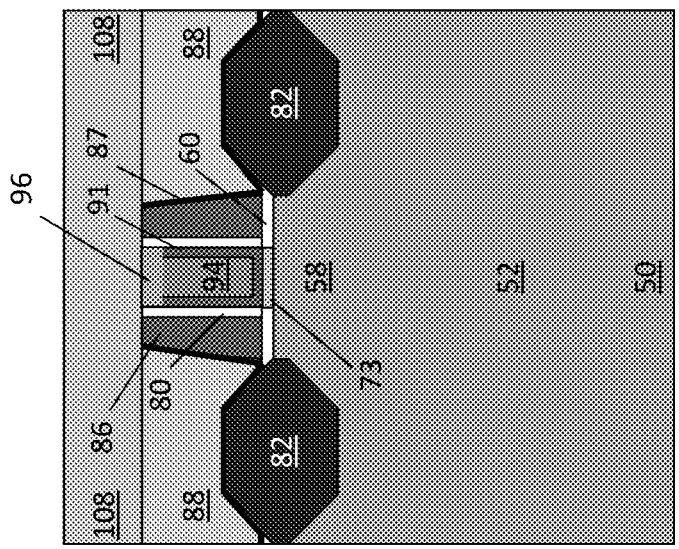
Figure 15A:
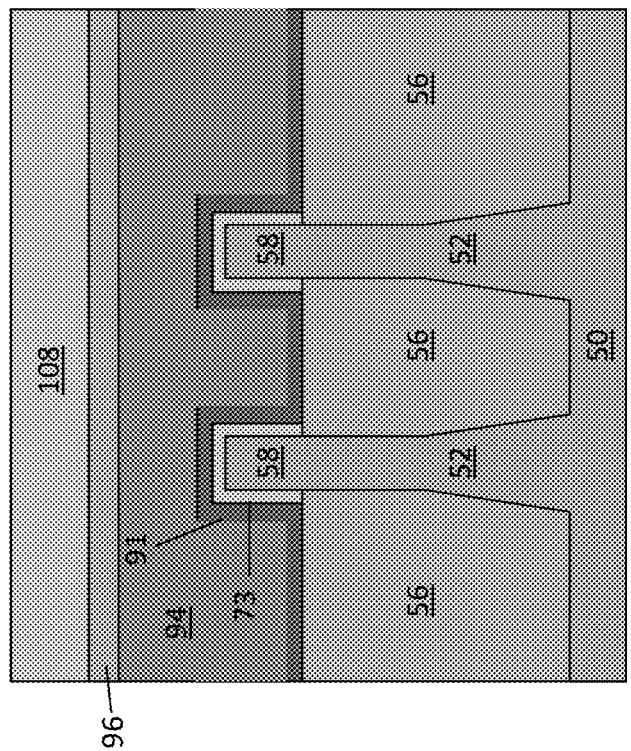

In FIGS. 15A and 15B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including the ferroelectric gate dielectric layer 91 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material used as the material for gate mask 96 extending over the first ILD 88. The subsequently formed gate contacts 110 (FIGS. 16A and 16B) penetrate through the gate mask 96 to contact the top surface of the recessed gate electrode 94.

Figure 16B:
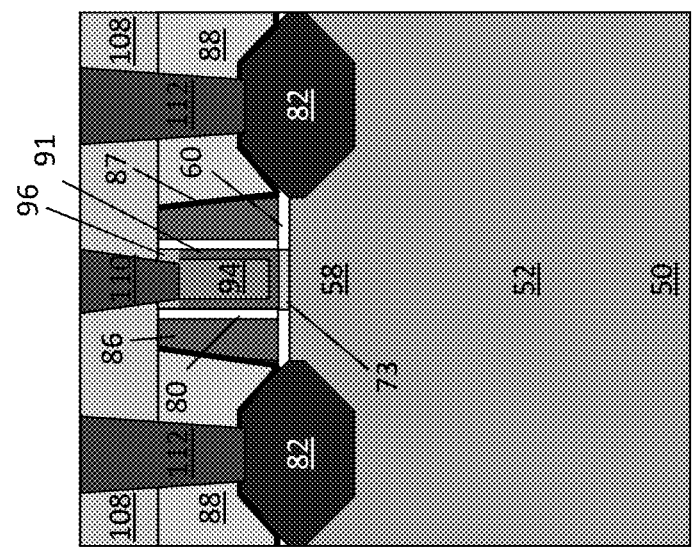
Figure 16A:
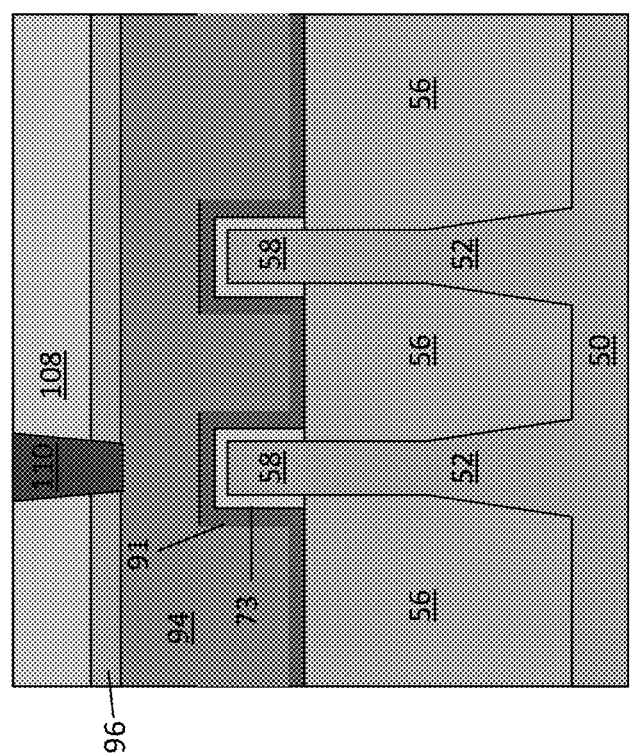

In FIGS. 16A and 16B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner, such as a diffusion barrier layer, an adhesion layer, or the like, and a conductive fill material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive fill material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments described in this disclosure provide methods of fabricating NCFET and FE-FET devices using a ferroelectric dielectric film having adjustable ferroelectric properties (e.g., $P_R$ and $E_C$) as the ferroelectric gate dielectric layer 91 of the gate dielectric stack of the NCFET and FE-FET device. An advantage of using the embodiments described herein is that the ferroelectric properties may be varied by altering the physical locations of dopant-source layers in an alternating sequence of dielectric layers 93 comprising high-k dielectric layers 77 and dopant-source layers 79, wherein the dopant-source layers 79 may be positioned with atomic level accuracy by using ALD/PEALD deposition techniques. After the sequence of dielectric layers 93 has been deposited, it may be converted to a ferroelectric gate dielectric film using a post-deposition anneal. The control over the ferroelectric properties, as described above, may provide stable NCFET and FE-FET FinFET devices that exhibit steep subthreshold slopes. Thereby the embodiments in this disclosure may enable FinFET CMOS integrated circuits with higher performance and lower standby power consumption.

In an embodiment, a method of forming a semiconductor device includes forming a gate dielectric stack, forming the gate dielectric stack includes forming an interfacial layer on at least a portion of a surface of a substrate; and forming a ferroelectric gate dielectric layer over the interfacial layer, forming the ferroelectric gate dielectric layer includes forming an alternating sequence of dielectric layers, forming an alternating sequence of dielectric layers includes depositing a first high-k dielectric layer over the interfacial layer, wherein at least a part of the first high-k dielectric layer is amorphous; and forming a plurality of pairs of dielectric layers over the first high-k dielectric layer, forming each pair of layers includes depositing a dopant-source layer; and depositing a second high-k dielectric layer over the dopant-source layer, wherein at least a part of the second high-k dielectric layer is amorphous; and after forming the alternating sequence of dielectric layers, performing a first anneal to transform the first high-k dielectric layer and the alternating sequence of dielectric layers to the ferroelectric gate dielectric layer. In an embodiment, forming the alternating sequence of dielectric layers includes performing an atomic layer deposition process. In an embodiment, performing the atomic layer deposition process includes performing one or more plasma-enhanced reaction pulses within one or more reaction cycles of the atomic layer deposition process. In an embodiment, the method further includes forming a conductive layer over the gate dielectric stack. In an embodiment, at least a portion of the conductive layer over the alternating sequence of dielectric layers is formed prior to performing the first anneal. In an embodiment, forming the alternating sequence of dielectric layers includes forming a first dopant-source layer which includes a first dopant species; and forming a second dopant-source layer which includes a second dopant species. In an embodiment, depositing the first high-k dielectric layer or the depositing the second high-k dielectric layer includes depositing hafnium oxide. In an embodiment, the dopant-source layer includes Si, La, or Zr atoms. In an embodiment, forming the ferroelectric gate dielectric layer further includes depositing another dopant-source layer over an uppermost high-k dielectric layer of an uppermost pair of dielectric layers of the plurality of pairs of dielectric layers.

In an embodiment, a method of forming a semiconductor device includes forming an interfacial layer on at least a portion of a surface of a substrate; forming a first hafnium oxide layer over the interfacial layer; depositing a first dopant-source layer over the first hafnium oxide layer; forming a second hafnium oxide layer over the first dopant-source layer; depositing a second dopant-source layer over the second hafnium oxide layer; forming a third hafnium oxide layer over the second dopant-source layer; and performing a first anneal to transform the first hafnium oxide layer, the first dopant-source layer, the second hafnium oxide layer, the second dopant-source layer, and the third hafnium oxide layer to a ferroelectric dielectric layer, the ferroelectric dielectric layer being an orthorhombic-phase polycrystalline hafnium oxide dielectric layer. In an embodiment, depositing the first hafnium oxide layer, the second hafnium oxide layer, and the third hafnium oxide layer includes performing an atomic layer deposition process. In an embodiment, the method further includes forming one or more additional hafnium oxide layers and forming one or more additional dopant-source layers, wherein adjacent hafnium oxide layers are separated by a dopant-source layer of the one or more additional dopant-source layers. In an embodiment, a thickness of an uppermost hafnium oxide layer and a lowermost hafnium oxide layer is less than a thickness of a middle hafnium oxide layer interposed between the uppermost hafnium oxide layer and the lowermost hafnium oxide layer. In an embodiment, a thickness of an uppermost hafnium oxide layer and a lowermost hafnium oxide layer is greater than a thickness of a middle hafnium oxide layer interposed between the uppermost hafnium oxide layer and the lowermost hafnium oxide layer. In an embodiment, thicknesses of the first hafnium oxide layer, the second hafnium oxide layer, and the one or more additional hafnium oxide layers are equal.

In an embodiment, a semiconductor device includes a semiconductor region; an interfacial layer disposed over the semiconductor region, the interfacial layer being a non-ferroelectric dielectric material; a ferroelectric dielectric layer disposed over the interfacial layer, wherein the ferroelectric dielectric layer is an orthorhombic-phase polycrystalline doped hafnium oxide, wherein dopants in the ferroelectric dielectric layer are distributed non-uniformly within the ferroelectric dielectric layer; and a conductive material over the ferroelectric dielectric layer. In an embodiment, a dopant profile of the dopants in the ferroelectric dielectric layer has at least two distinct convex regions. In an embodiment, a dopant profile of the dopants is offset from a lower surface and an upper surface of the ferroelectric dielectric layer. In an embodiment, the interfacial layer and the ferroelectric dielectric layer form a dielectric stack, wherein a capacitance of the dielectric stack is negative for at least some range of gate bias. In an embodiment, the ferroelectric dielectric layer has a thickness between 1 nm and 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a gate dielectric stack, forming the gate dielectric stack comprising:
        forming an interfacial layer on at least a portion of a surface of a substrate; and
        forming a ferroelectric gate dielectric layer over the interfacial layer, forming the ferroelectric gate dielectric layer comprising:
            forming an alternating sequence of dielectric layers, forming the alternating sequence of dielectric layers comprising:
                depositing a first high-k dielectric layer over the interfacial layer, wherein at least a part of the first high-k dielectric layer is amorphous; and
                forming a plurality of pairs of dielectric layers over the first high-k dielectric layer, forming each pair of layers comprising:
                    depositing a dopant-source layer; and
                    depositing a second high-k dielectric layer over the dopant-source layer, wherein at least a part of the second high-k dielectric layer is amorphous; and
            after forming the alternating sequence of dielectric layers, performing a first anneal to transform the alternating sequence of dielectric layers to the ferroelectric gate dielectric layer, wherein an upper surface of an uppermost layer of the second high-k-dielectric layers is exposed during the first anneal.

2. The method of claim 1, wherein forming the alternating sequence of dielectric layers comprises performing an atomic layer deposition process.

3. The method of claim 2, wherein performing the atomic layer deposition process comprises performing one or more plasma-enhanced reaction pulses within one or more reaction cycles of the atomic layer deposition process.

4. The method of claim 1, further comprising forming a conductive layer over the gate dielectric stack.

5. The method of claim 4, wherein at least a portion of the conductive layer over the alternating sequence of dielectric layers is formed prior to performing the first anneal.

6. The method of claim 1, wherein forming the alternating sequence of dielectric layers comprises:
 forming a first dopant-source layer comprising a first dopant species; and
 forming a second dopant-source layer comprising a second dopant species.

7. The method of claim 1, wherein depositing the first high-k dielectric layer or the depositing the second high-k dielectric layer comprises depositing hafnium oxide.

8. The method of claim 7, wherein the dopant-source layer comprises Si, La, or Zr atoms.

9. A method of forming a semiconductor device, the method comprising:
 forming an interfacial layer on at least a portion of a surface of a substrate;
 forming a first hafnium oxide layer over the interfacial layer;
 depositing a first dopant-source layer over the first hafnium oxide layer;
 forming a second hafnium oxide layer over the first dopant-source layer;
 depositing a second dopant-source layer over the second hafnium oxide layer;
 forming a third hafnium oxide layer over the second dopant-source layer; and
 performing a first anneal to transform the first hafnium oxide layer, the first dopant-source layer, the second hafnium oxide layer, the second dopant-source layer, and the third hafnium oxide layer to a ferroelectric dielectric layer, wherein the first anneal is performed while an upper surface of the third hafnium oxide layer is exposed, the ferroelectric dielectric layer being an orthorhombic-phase polycrystalline hafnium oxide dielectric layer.

10. The method of claim 9, wherein depositing the first hafnium oxide layer, the second hafnium oxide layer, and the third hafnium oxide layer comprises performing an atomic layer deposition process.

11. The method of claim 10 further comprising forming one or more additional hafnium oxide layers and forming one or more additional dopant-source layers, wherein adjacent hafnium oxide layers are separated by a dopant-source layer of the one or more additional dopant-source layers.

12. The method of claim 11, wherein a thickness of an uppermost hafnium oxide layer and a lowermost hafnium oxide layer is less than a thickness of a middle hafnium oxide layer interposed between the uppermost hafnium oxide layer and the lowermost hafnium oxide layer.

13. The method of claim 11, wherein a thickness of an uppermost hafnium oxide layer and a lowermost hafnium oxide layer is greater than a thickness of a middle hafnium oxide layer interposed between the uppermost hafnium oxide layer and the lowermost hafnium oxide layer.

14. The method of claim 11, wherein thicknesses of the first hafnium oxide layer, the second hafnium oxide layer, and the one or more additional hafnium oxide layers are equal.

15. A method of forming a semiconductor device, the method comprising:
 forming an interfacial layer on at least a portion of a surface of a substrate; and
 forming a ferroelectric gate dielectric layer over the interfacial layer, wherein the ferroelectric gate dielectric layer is an orthorhombic-phase polycrystalline doped hafnium oxide, wherein dopants in the ferroelectric gate dielectric layer are distributed non-uniformly within the ferroelectric gate dielectric layer, wherein forming the ferroelectric gate dielectric layer comprises:
  forming alternating layers of a high-k dielectric material layer and a dopant-source material layer, and
  annealing to transform the alternating layers the high-k dielectric material layer and the dopant-source material layer, wherein an uppermost layer of the high-k dielectric material layer is exposed during the annealing.

16. The method of claim 15, wherein forming the ferroelectric gate dielectric layer comprises:
 forming an alternating sequence of high-k dielectric layers and a dopant-source layers; and
 performing a first anneal to transform the alternating sequence of the high-k dielectric layers and the dopant-source layers to the ferroelectric gate dielectric layer.

17. The method of claim 15, wherein a dopant profile of the dopants in the ferroelectric gate dielectric layer has at least two distinct convex regions.

18. The method of claim 15, wherein a peak of a dopant profile of the dopants is offset from a lower surface and an upper surface of the ferroelectric gate dielectric layer.

19. The method of claim 15, wherein a ratio of a thickness of a bottommost high-k dielectric layer to a total thickness of high-k dielectric material layers of the alternating layers the high-k dielectric material layer and the dopant-source material layer is in a range between 0.5 and 0.9.

20. The method of claim 1, wherein a ratio of a thickness of each of the first high-k dielectric layer and the second high-k dielectric layers to a total thickness the first high-k dielectric layer and the second high-k dielectric layers is in a range between 0.005 and 0.3.

* * * * *